(12) United States Patent
Maeda et al.

(10) Patent No.: US 11,538,657 B2
(45) Date of Patent: Dec. 27, 2022

(54) ALIGNMENT SYSTEM AND SEAL FOR POSITIONAL ALIGNMENT

(71) Applicants: Hitachi High-Tech Corporation, Tokyo (JP); RIKEN, Wako (JP)

(72) Inventors: Yaku Maeda, Tokyo (JP); Yoshinobu Hoshino, Tokyo (JP); Kiminori Toyooka, Wako (JP)

(73) Assignees: Hitachi High-Tech Corporation, Tokyo (JP); RIKEN, Wako (JP)

( * ) Notice: Subject to any disclaimer, the term of this patent is extended or adjusted under 35 U.S.C. 154(b) by 0 days.

(21) Appl. No.: 17/281,296

(22) PCT Filed: Oct. 18, 2019

(86) PCT No.: PCT/JP2019/041027
§ 371 (c)(1),
(2) Date: Mar. 30, 2021

(87) PCT Pub. No.: WO2020/080508
PCT Pub. Date: Apr. 23, 2020

(65) Prior Publication Data
US 2021/0407761 A1 Dec. 30, 2021

(30) Foreign Application Priority Data
Oct. 19, 2018 (JP) .............................. JP2018-197708

(51) Int. Cl.
*H01J 37/20* (2006.01)
*H01J 37/22* (2006.01)
(52) U.S. Cl.
CPC .............. *H01J 37/20* (2013.01); *H01J 37/22* (2013.01); *H01J 2237/20285* (2013.01)
(58) Field of Classification Search
CPC .. H01J 37/20; H01J 37/22; H01J 37/26; H01J 37/28; H01J 37/16; H01J 2237/20285
(Continued)

(56) References Cited

U.S. PATENT DOCUMENTS 8,304,745 B2 11/2012 Heise et al.
9,368,321 B1 6/2016 Randolph et al.
(Continued)

FOREIGN PATENT DOCUMENTS

JP 6-13011 A 1/1994
JP 2009-176572 A 8/2009
(Continued)

OTHER PUBLICATIONS

International Search Report (PCT/ISA/210) issued in PCT Application No. PCT/JP2019/041027 dated Jan. 7, 2020 with English translation (four (4) pages).
(Continued)

*Primary Examiner* — Jason L McCormack
(74) *Attorney, Agent, or Firm* — Crowell & Moring LLP

(57) ABSTRACT

An alignment system that realizes high reproducibility of position information during re-observation and in which a user can efficiently and easily re-observe an area of interest is provided. An alignment system that enables correlative observation between the imaging device 104 and the charged particle beam device 100, in which a plurality of positional alignment points are set on a sample carrier in a state where a sample is placed on the sample carrier, the alignment controller 153 obtains a transformation matrix that transforms a coordinate system of the imaging device and a coordinate system of the charged particle beam device based on position information and magnification of each of the plurality of positional alignment points when a first image is imaged by an imaging device and position information and magnification of each of a plurality of positional alignment points when observing by a charged particle beam device, and transforms a field of view designated for the first image into field-of-view information of the charged particle beam device by using the transformation matrix.

16 Claims, 16 Drawing Sheets

(58) Field of Classification Search
USPC ............... 250/442.11, 440.11, 306, 307, 311
See application file for complete search history.

(56) References Cited

U.S. PATENT DOCUMENTS

| | | |
|---|---|---|
| 2003/0025087 A1 | 2/2003 | Schamber et al. |
| 2008/0095424 A1 | 4/2008 | Iki et al. |
| 2012/0133757 A1 | 5/2012 | Thomas et al. |
| 2013/0101188 A1 | 4/2013 | Sievers et al. |
| 2015/0060666 A1 | 3/2015 | Hatakeyama et al. |
| 2015/0357157 A1* | 12/2015 | Mueller ................. H01J 37/10 |
| | | 250/396 R |
| 2017/0092460 A1 | 3/2017 | Kiyohara et al. |
| 2018/0088306 A1 | 3/2018 | Suzuki |

FOREIGN PATENT DOCUMENTS

| | | |
|---|---|---|
| JP | 2015-62200 A | 4/2015 |
| JP | 2016-119300 A | 6/2016 |
| JP | 2017-69024 A | 4/2017 |
| JP | 2018-55924 A | 4/2018 |
| WO | WO 2006/033273 A1 | 3/2006 |

OTHER PUBLICATIONS

Japanese-language Written Opinion (PCT/ISA/237) issued in PCT Application No. PCT/JP2019/041027 dated Jan. 7, 2020 (four (4) pages).

* cited by examiner

[FIG. 1]
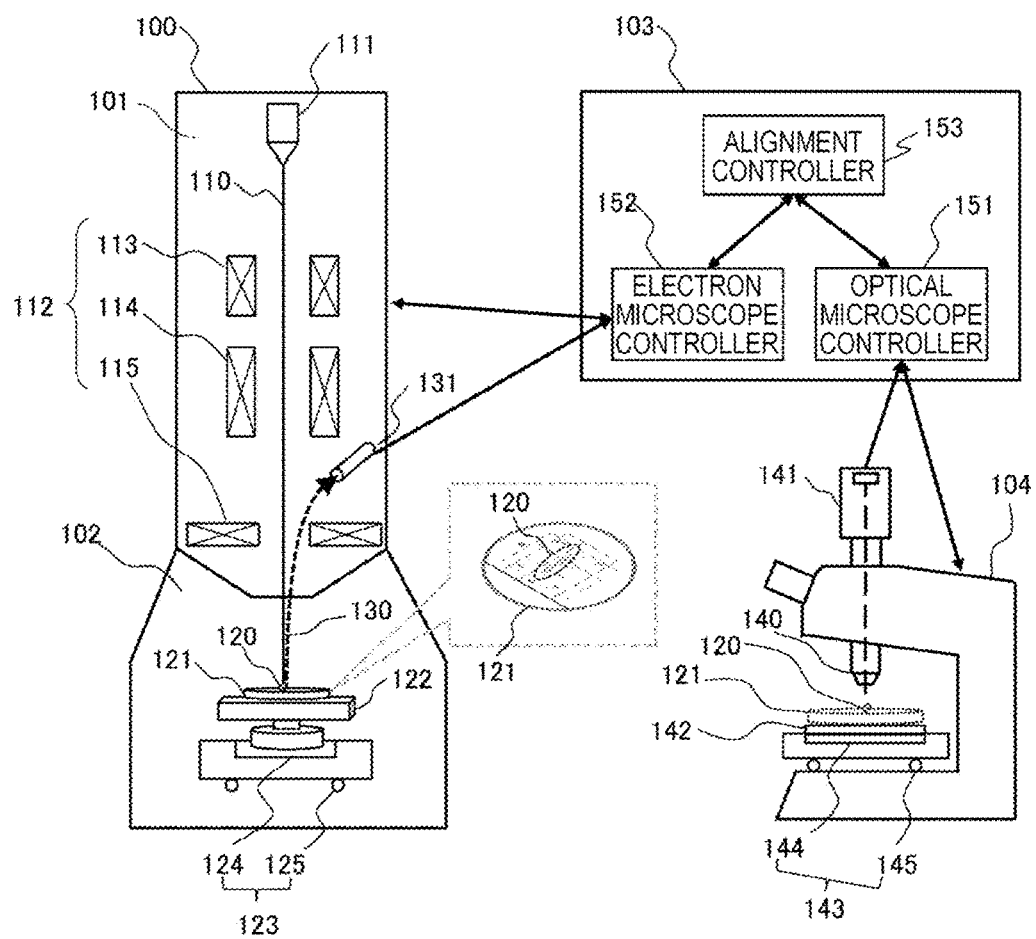

[FIG. 2]
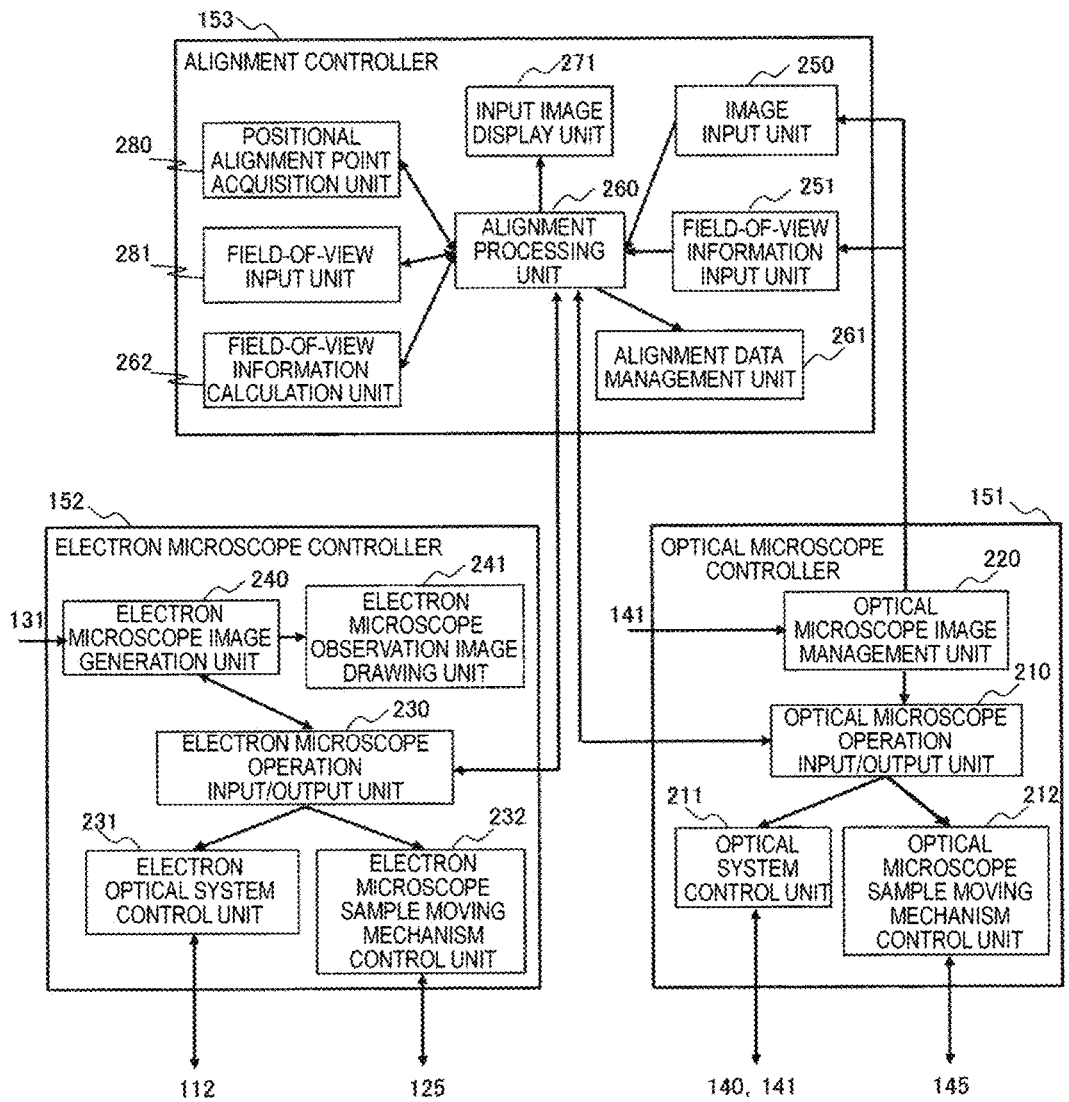

[FIG. 3]
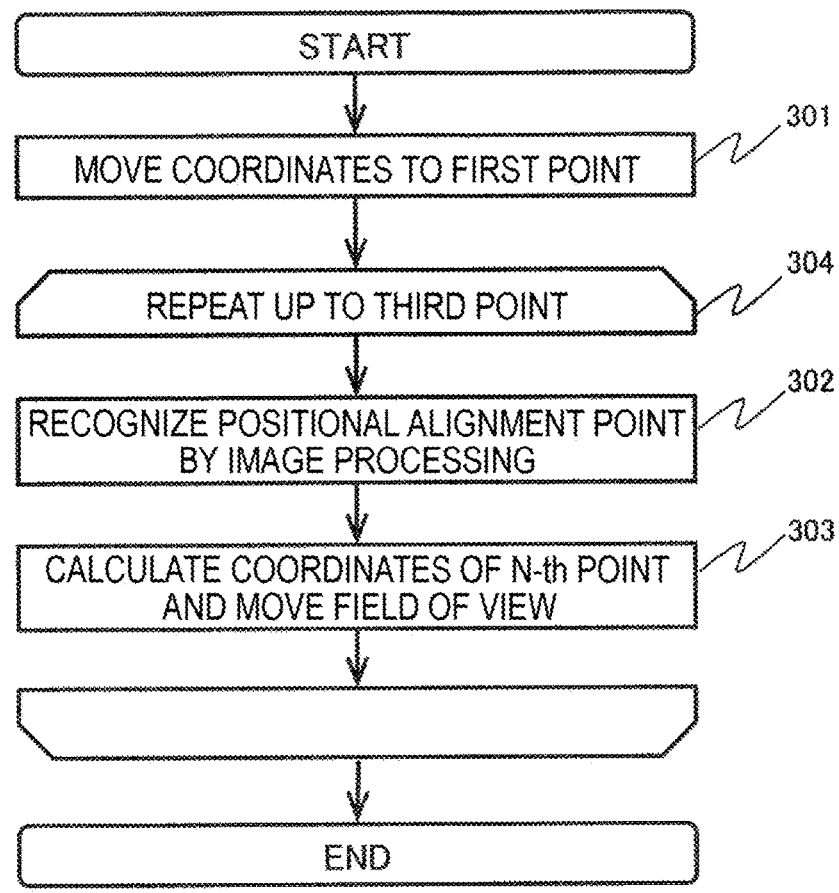
[FIG. 4A]
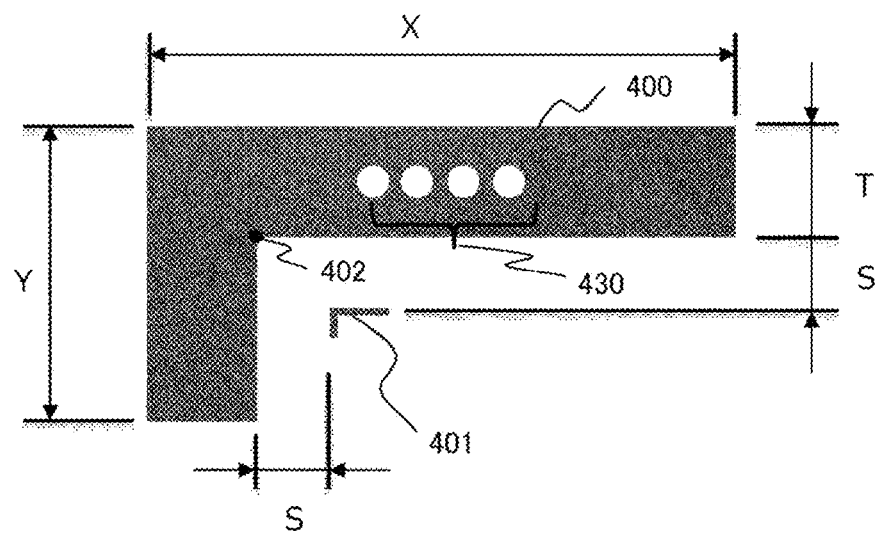

[FIG. 4B]
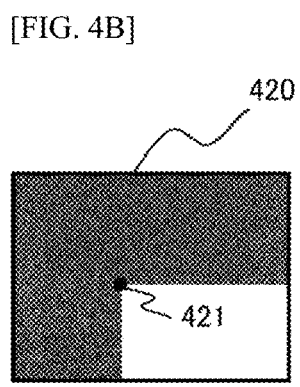

[FIG. 4C]
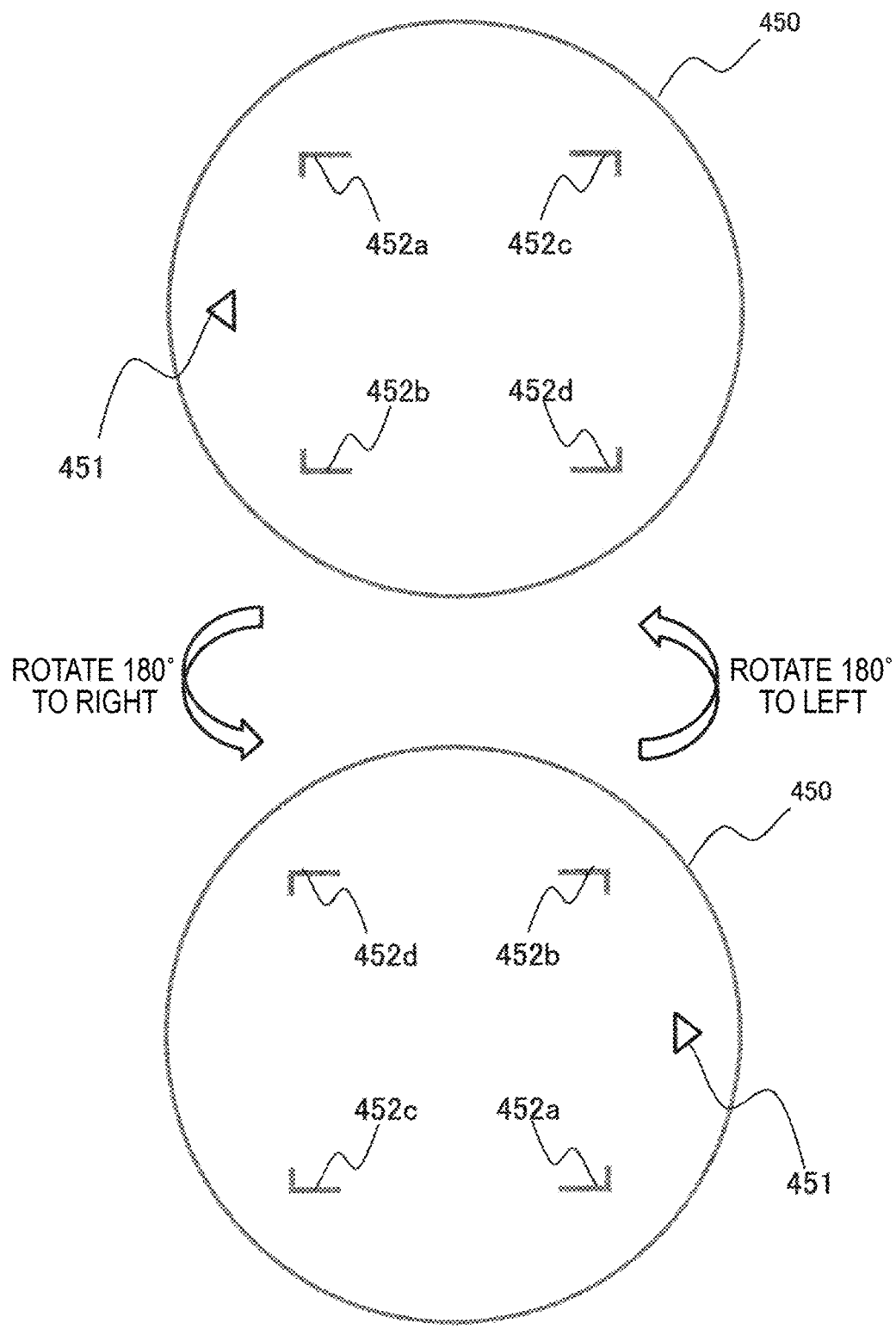

[FIG. 5A]
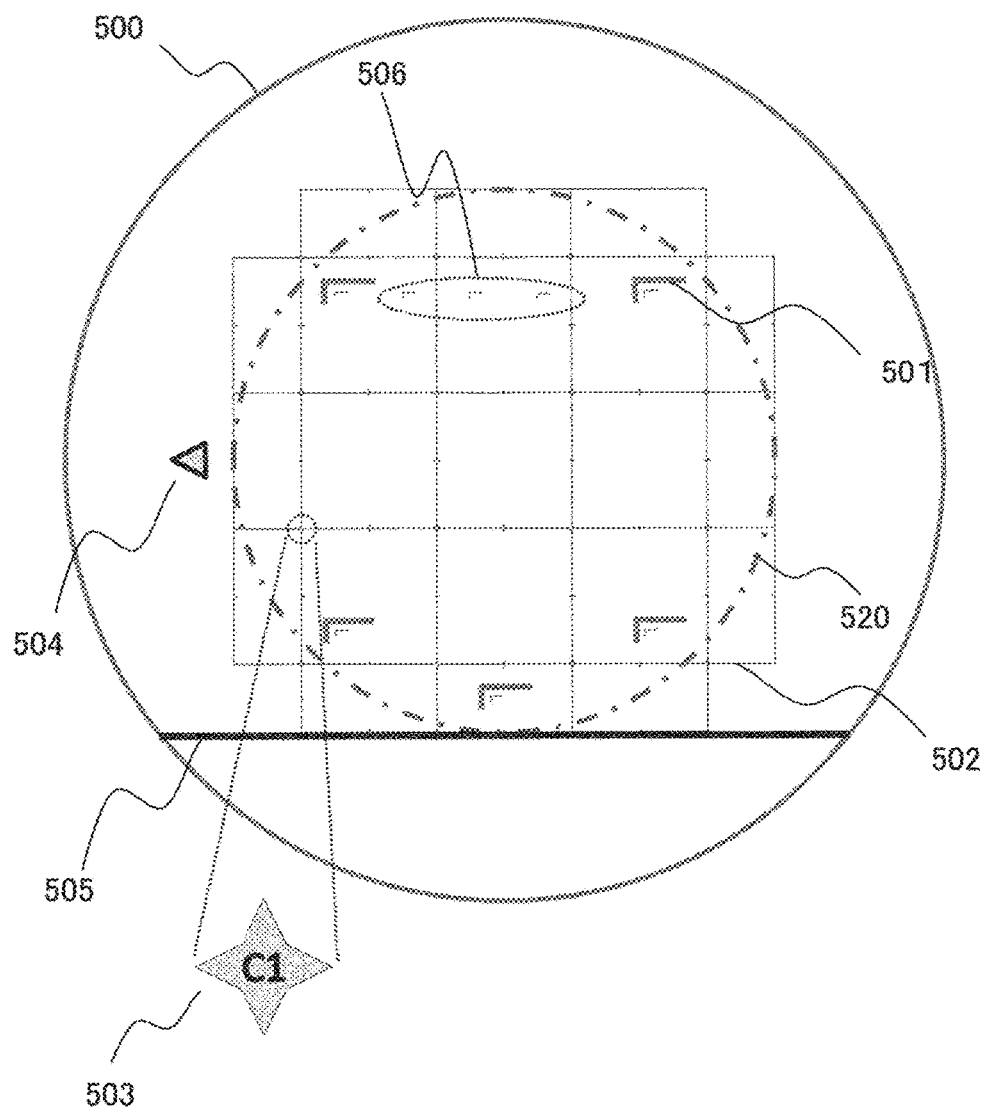
[FIG. 5B]
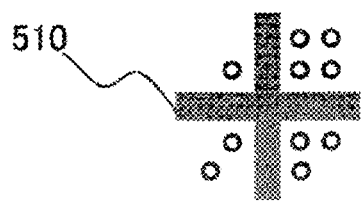

[FIG. 6]
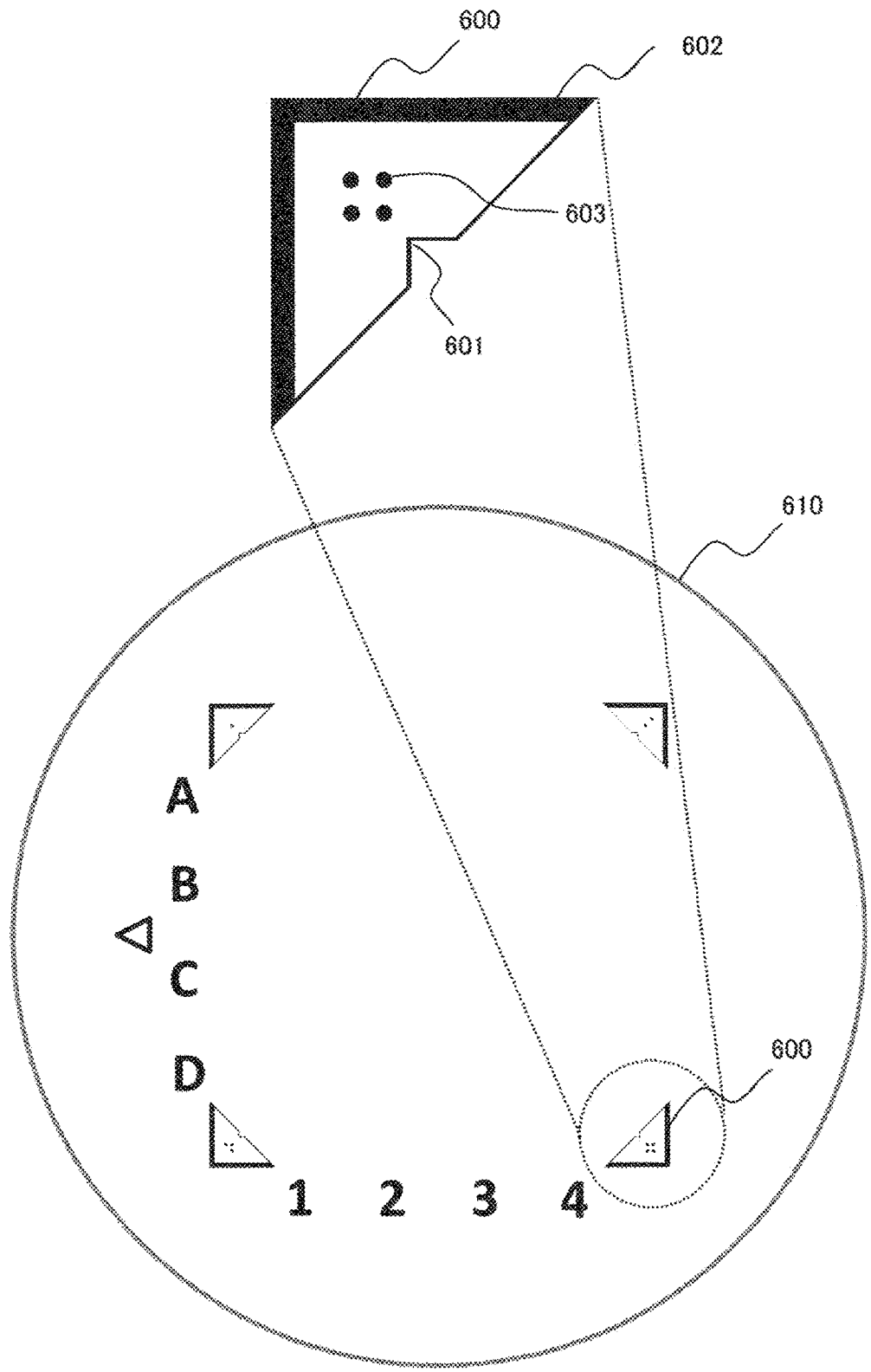

[FIG. 7]
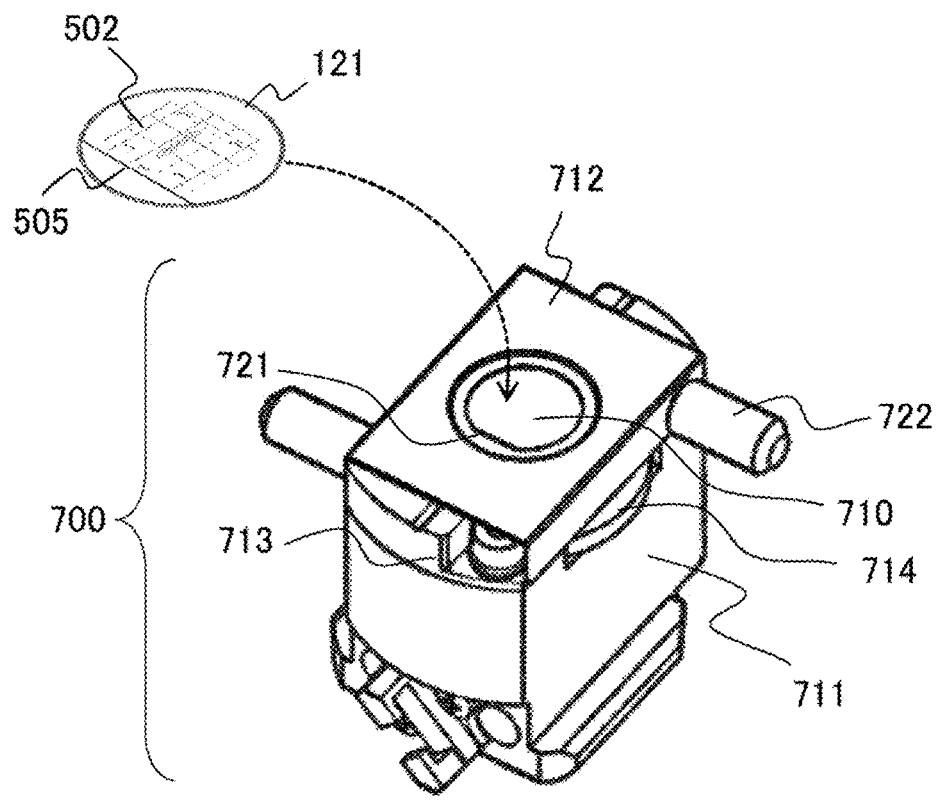
[FIG. 8]
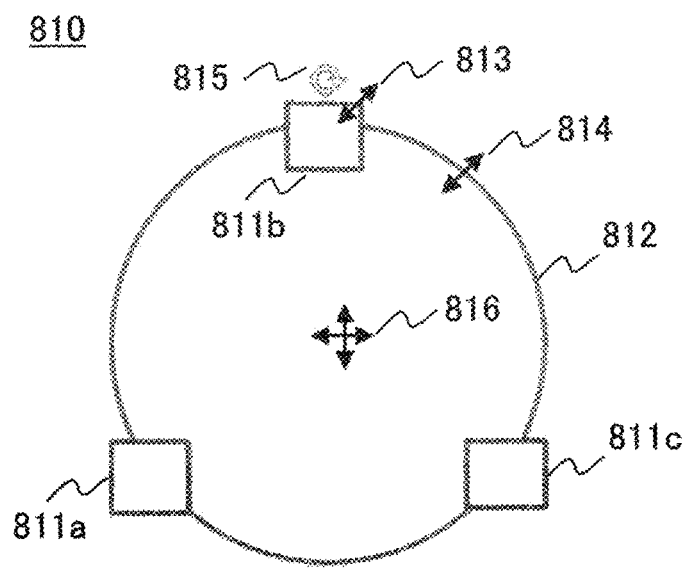

[FIG. 9]
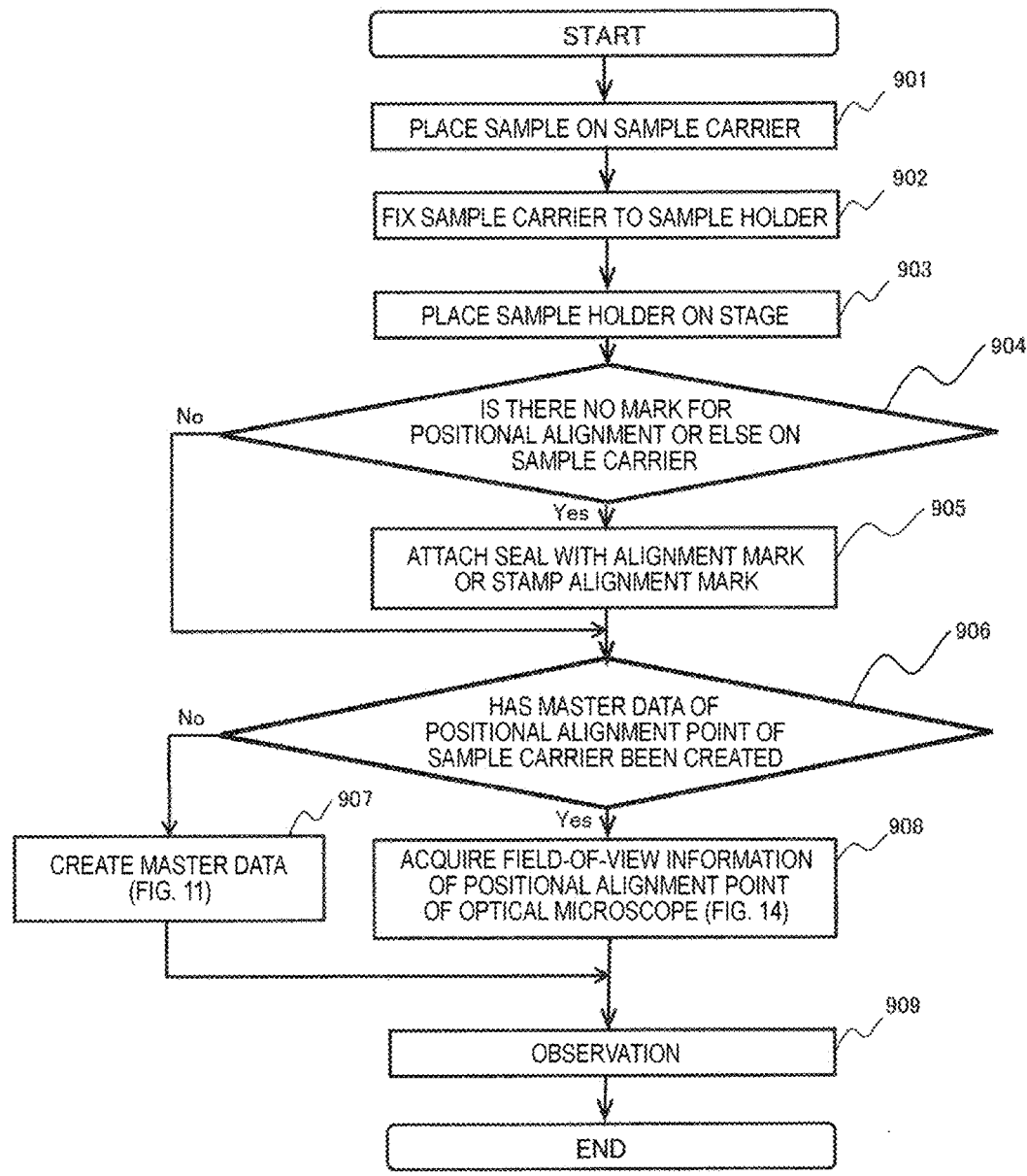

[FIG. 10A]
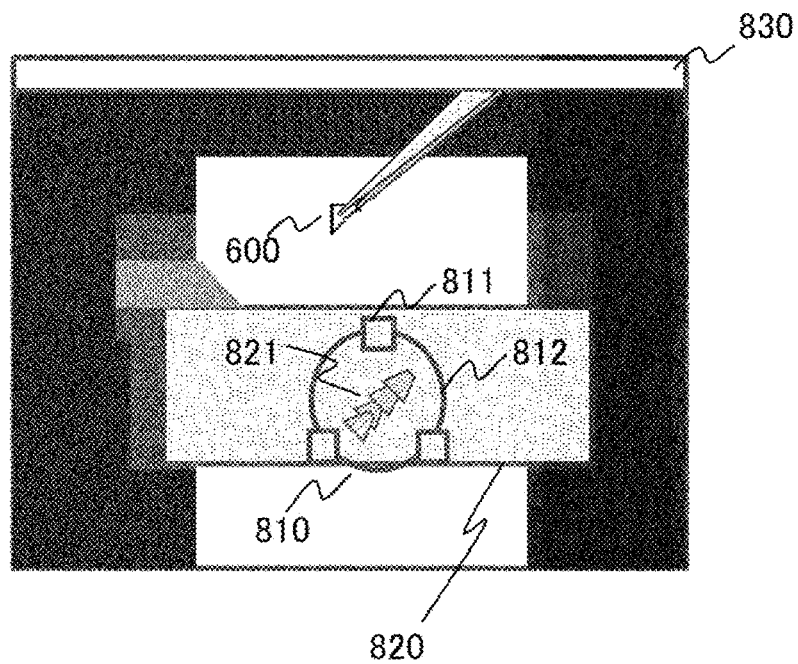
[FIG. 10B]
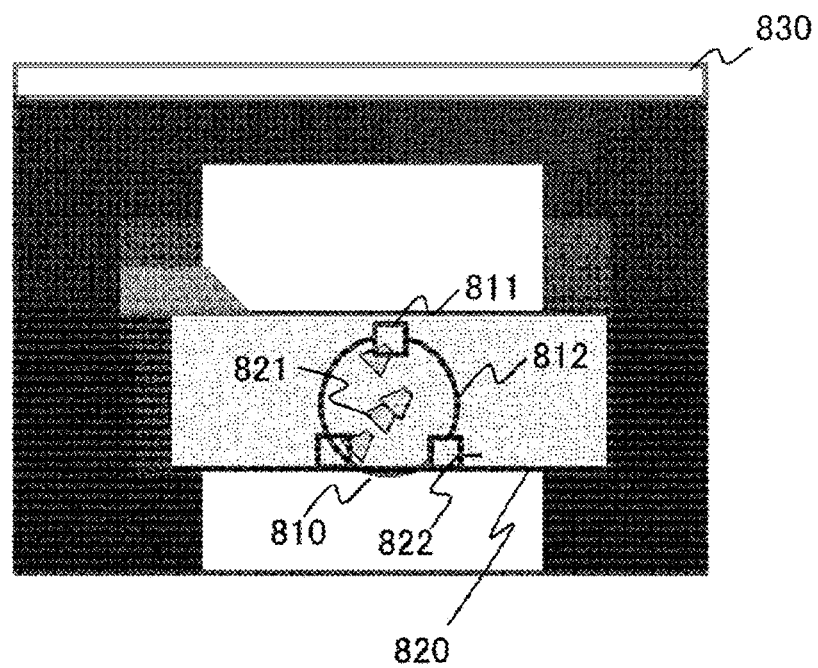

[FIG. 11]
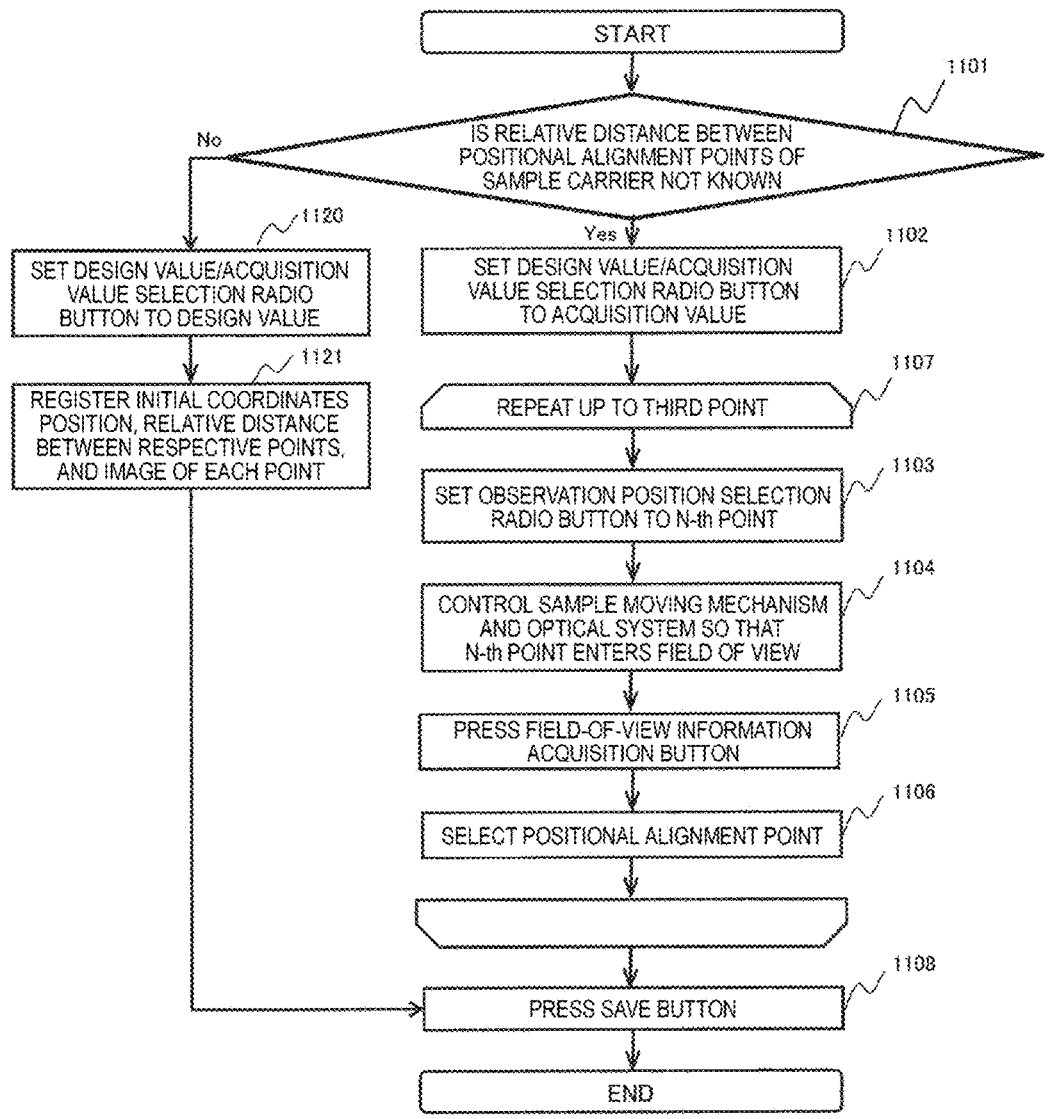

[FIG. 12]
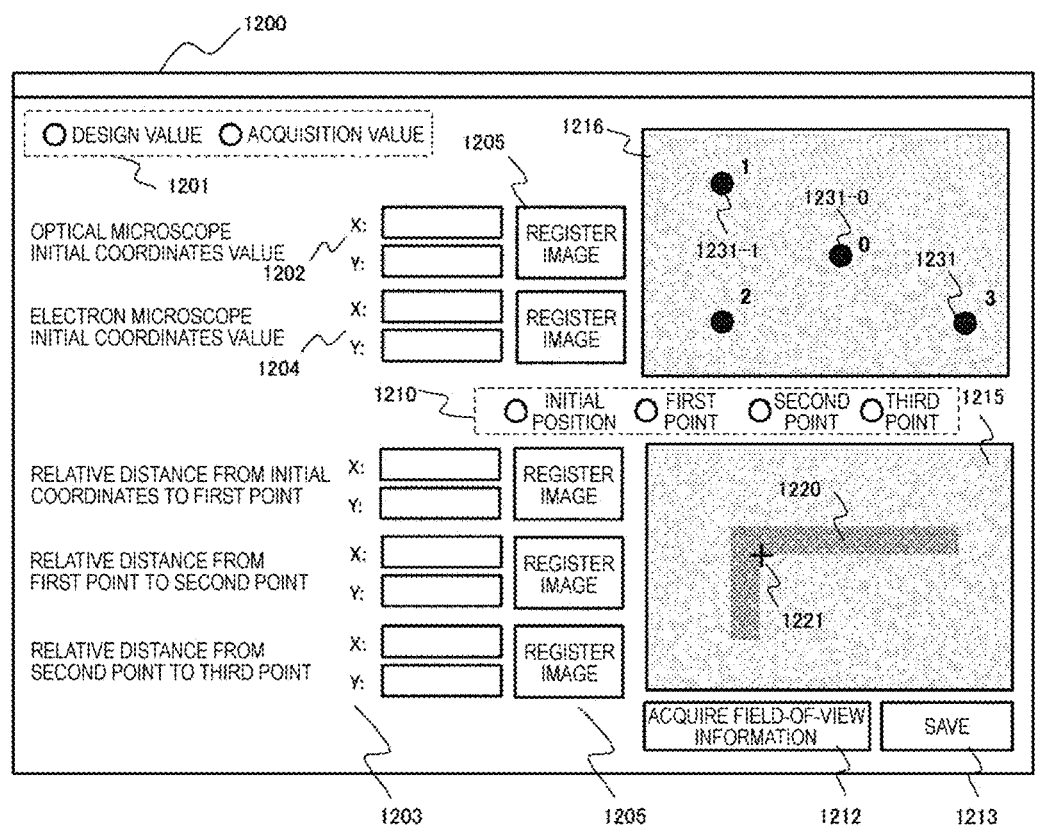

[FIG. 13]
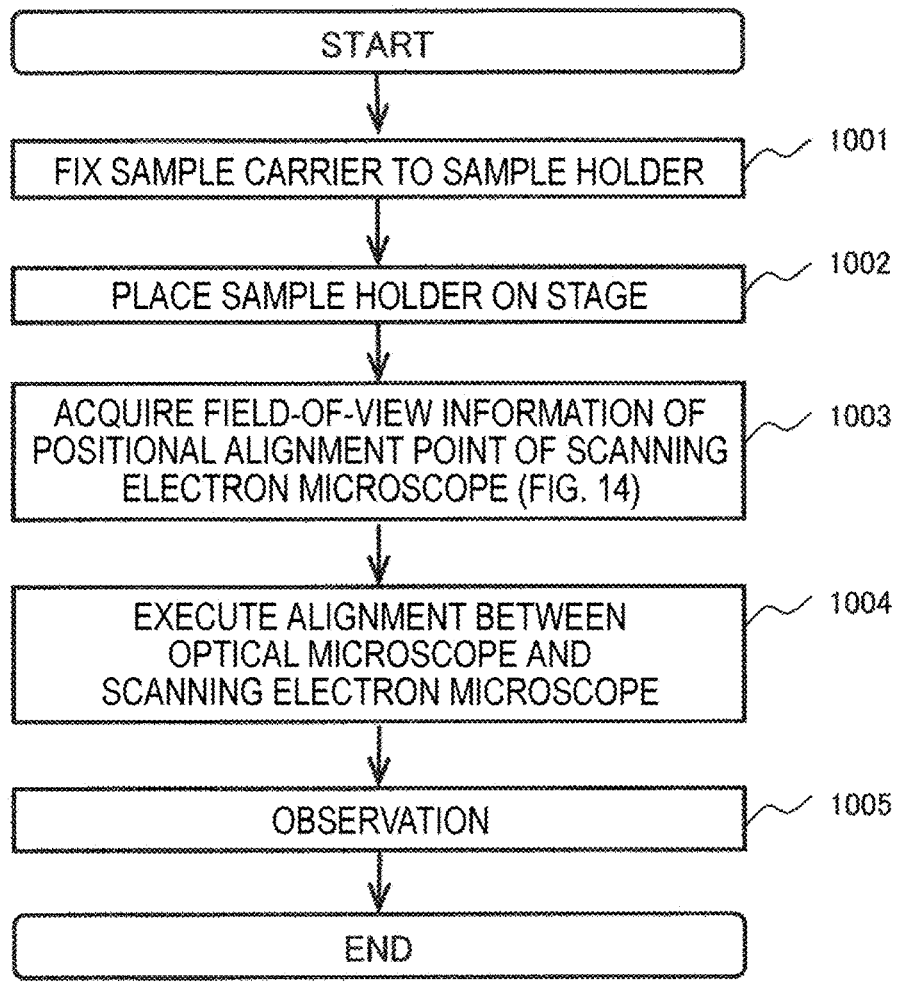

[FIG. 14]
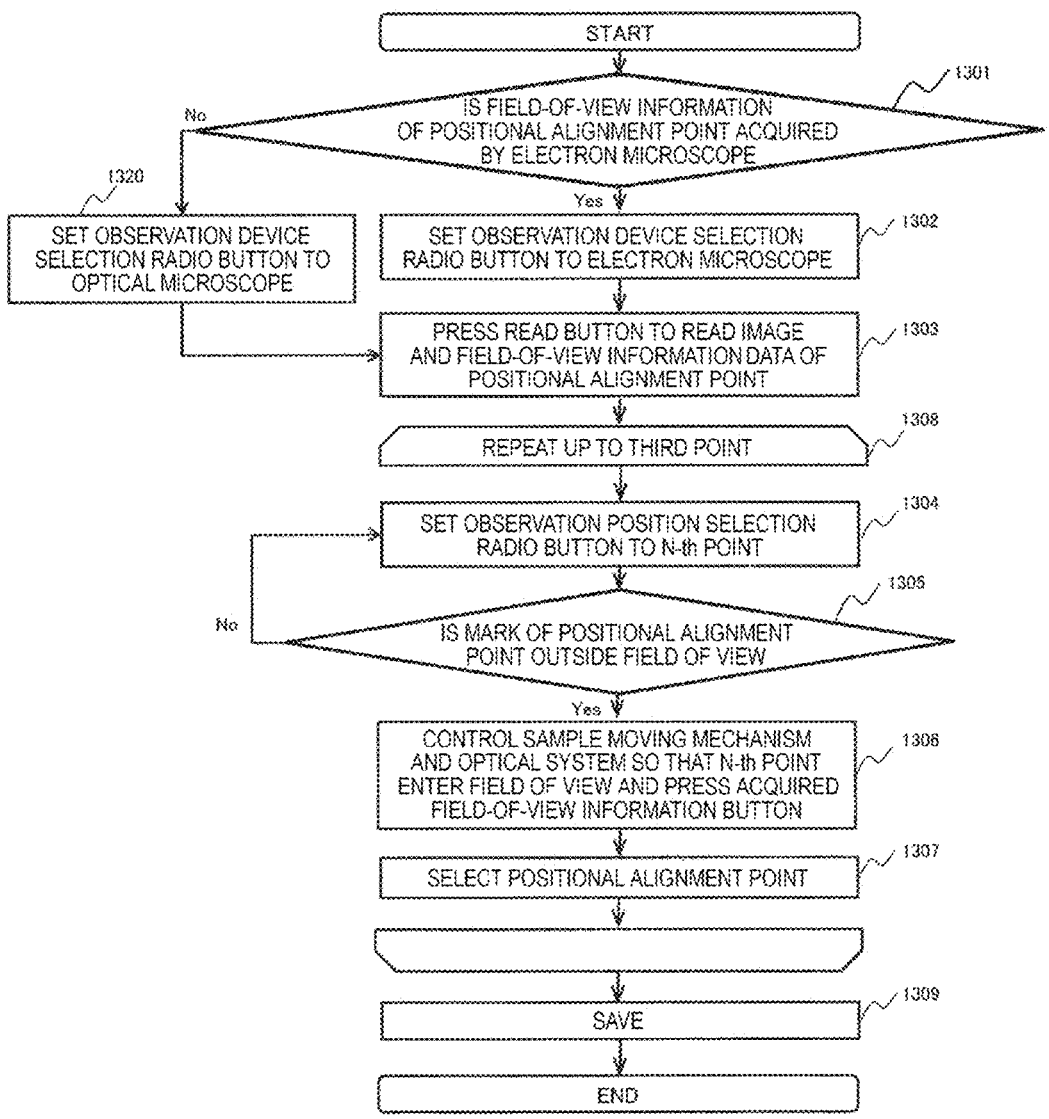

[FIG. 15]
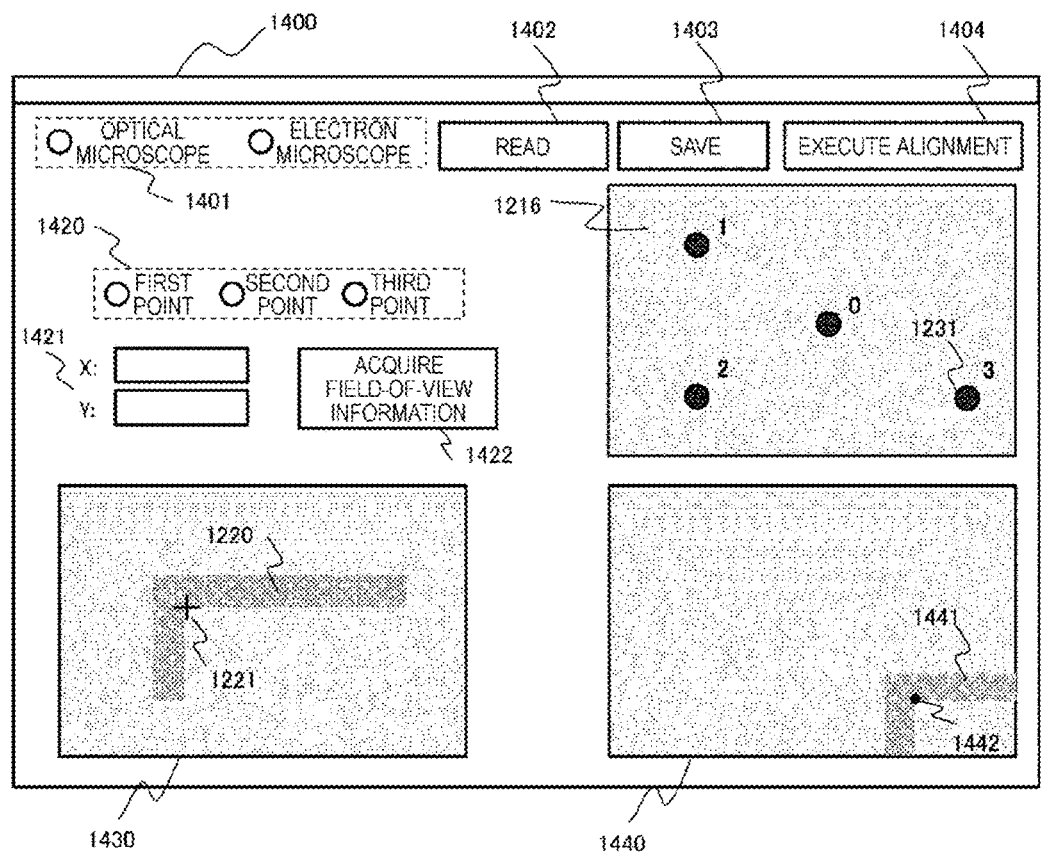

[FIG. 16]
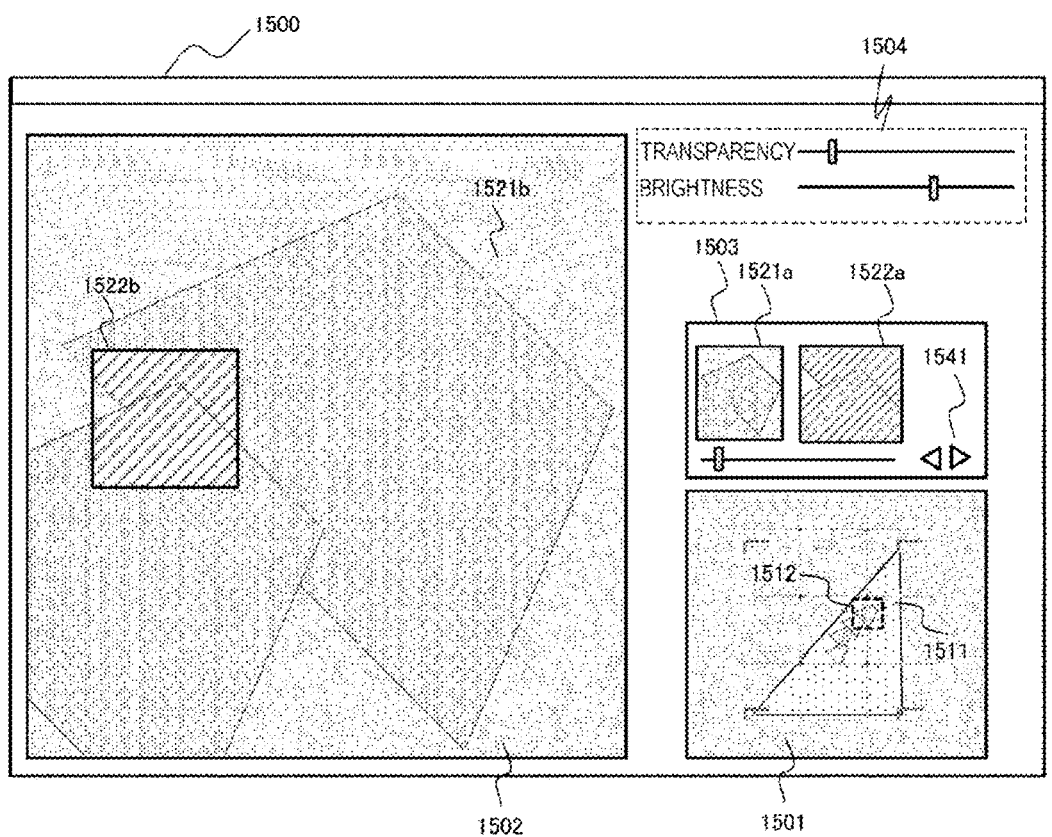

ALIGNMENT SYSTEM AND SEAL FOR POSITIONAL ALIGNMENT

TECHNICAL FIELD

The present invention relates to an alignment system that enables correlative observation between an imaging device that acquires an image and a charged particle beam device.

BACKGROUND ART

In the charged particle beam device represented by a scanning electron microscope (SEM), a charged particle beam finely focused by an electrostatic lens, an electromagnetic lens, or the like is scanned on a sample, and desired information (for example, a sample surface image) is obtained from the sample. When observing the sample with such a device, it is necessary to determine which position of the sample a current field of view corresponds to and move the field of view to a point which is desired to be observed (hereinafter referred to as "field of view search").

Since the charged particle beam device uses a charged particle beam having a wavelength shorter than that of light, the charged particle beam device has an advantage that resolution is higher than that of an optical microscope and a sample (or sample structure) having a size of an order of several nm to several μm can be observed. On the other hand, in the charged particle beam device, depending on conditions of an electron optical system, the minimum magnification when observing the sample is determined to be a magnification that cannot accommodate an entire view of the sample. As a result, for example, it is difficult to find a field of view search that specifies an observation field of view of several nm to several hundred μm from the entire sample area on an order of several cm or several mm.

In response to such problem, in U.S. Patent Application Publication No. 2012/0133757 Specification (PTL 1), the same sample holder having a mark for alignment in both devices is proposed in order to realize correlative observation between the charged particle beam device and the optical microscope. In U.S. Pat. No. 8,304,745 Specification (PTL 2), an optical microscope may target transmitted light, and a sample holder that is provided with an opening or an optical transmission portion to detect an alignment mark is proposed.

In International Publication No. 2006/033273 (PTL 3), although it is a single optical microscope, an example, in which a label, a corner of a cover glass, a corner of a slide glass, or the like may be used as an alignment point when observing the same field of view when observing the slide glass many times, is disclosed.

CITATION LIST

Patent Literature

PTL 1: U.S. Patent Application Publication No. 2012/0133757 Specification
PTL 2: U.S. Pat. No. 8,304,745 Specification
PTL 3: International Publication No. 2006/033273

SUMMARY OF INVENTION

Technical Problem

When observing a sample such as a cell section, generally, the sample which is an observation target is placed on a cover glass, and the cover glass on which the sample is placed is fixed to a sample holder and observation by an observation device is performed. Accordingly, the cover glass attached to the sample holder is replaced for each sample to be observed. When re-observation is performed, a square or rectangular-shaped cover glass, which is a general shape, can be attached to the sample holder even if it is rotated 90° or 180° with respect to an attachment direction at the time of previous observation. In the case of a round cover glass, since a rotation direction is free, it is difficult to attach the round cover glass to the sample holder at exactly the same angle as the attachment direction at the time of the previous observation when re-observation is performed. In PTLs 1 and 2, since the alignment mark is provided on the sample holder, and an observation position is recorded with the alignment mark of the sample holder as a reference, in the re-observation, the re-observation cannot be performed unless the cover glass is installed to match the attachment direction at the time of the previous observation.

Even if the attachment directions match, since an installation portion of the cover glass of the sample holder is designed to be slightly larger than the size of the cover glass in order to install the cover glass, minute translation and rotation are allowed when installing the cover glass. That is, when the cover glass is reattached for re-observation, since a positional relationship with the alignment mark and a positional relationship with the sample which is the observation target are considerably different from those at the time of the previous observation, position information does not exactly match with that at the time of the previous observation. Although it is a minute error, it becomes a large error in a charged particle beam device having a high observation magnification, and it also becomes a factor that causes a targeted structure to escape from within the field of view range especially when observing at a high magnification.

PTL 3 describes, as an example, a label whose positional relationship with the cell section does not collapse, an angle of a slide glass, and the like, but does not describe any alignment with anything other than the optical microscope. Since it is necessary to have conductivity when observing with the charged particle beam device, the label and slide glass that are generally non-conductive cannot be observed with the charged particle beam device.

Solution to Problem

An alignment system according to an embodiment of the present invention includes a sample carrier on which a sample is placed, a charged particle beam device including a charged particle optical system that irradiates the sample placed on the sample carrier with a charged particle beam and a detector that detects a signal generated by irradiating the sample with the charged particle beam, and an alignment controller to which a first image obtained by imaging the sample placed on the sample carrier by an imaging device and field-of-view information of the imaging device corresponding to the first image are input, and the alignment controller includes a positional alignment point acquisition unit that acquires field-of-view information of a plurality of positional alignment points of the sample carrier placed on the charged particle beam device, an alignment processing unit that obtains a transformation matrix that transforms a coordinate system of the imaging device and a coordinate system of the charged particle beam device based on position information and magnification of each of the plurality of positional alignment points when the first image is imaged by the imaging device, and position information and magnification of each of the plurality of positional alignment points acquired by the positional alignment point acquisition unit, and a field-of-view information calculation unit that transforms a field of view designated for the first image into field-of-view information of the charged particle beam device by using the transformation matrix, and the plurality of positional alignment points are set on the sample carrier in a state where the sample is placed.

Other problems to be solved and novel features will become apparent from the description of the specification and accompanying drawings.

Advantageous Effects of Invention

An alignment system with high reproducibility of position information during re-observation is realized, and the user can efficiently and easily re-observe an area of interest.

BRIEF DESCRIPTION OF DRAWINGS

FIG. 1 is a schematic configuration diagram of an alignment system of a scanning electron microscope and an optical microscope.

FIG. 2 is a functional block diagram of a system controller of the alignment system.

FIG. 3 is a flowchart of a simple alignment function.

FIG. 4A is a configuration example of an alignment mark.

FIG. 4B is another configuration example of the alignment mark.

FIG. 4C is a configuration example of a sample carrier with alignment mark.

FIG. 5A is a configuration example of the sample carrier with alignment mark.

FIG. 5B is an example of an initial position mark.

FIG. 6 is a diagram illustrating a state in which a seal with alignment mark is attached to a sample carrier.

FIG. 7 is a bird's-eye view of the sample holder.

FIG. 8 is an example of a recommended position guide for guiding a recommended position of a positional alignment point.

FIG. 9 is an observation workflow of an observation sample by an optical microscope in an alignment system.

FIG. 10A is an example of a user interface screen that guides an arrangement of alignment marks.

FIG. 10B is an example of setting a characteristic structure of an observation image to a positional alignment point using the user interface screen of FIG. 10A.

FIG. 11 is a master data creation workflow.

FIG. 12 is an example of a user interface screen for creating master data.

FIG. 13 is a correlative observation workflow of an observation sample by a scanning electron microscope in an alignment system.

FIG. 14 is a flowchart for acquiring field-of-view information of the positional alignment point.

FIG. 15 is an example of a user interface screen that acquires the field-of-view information of the positional alignment point and executes alignment.

FIG. 16 is an example of a user interface screen of an input image display unit.

DESCRIPTION OF EMBODIMENTS

Hereinafter, an alignment system between a charged particle beam device and an imaging device according to an embodiment of the present invention will be described with reference to the drawings. FIG. 1 is a schematic configuration diagram of an alignment system in which a scanning electron microscope is applied as the charged particle beam device and an optical microscope is applied as the imaging device. The alignment system includes, as its main configuration, a scanning electron microscope 100, an optical microscope 104, and a system controller 103 that controls each of the scanning electron microscope 100 and the optical microscope 104.

In the scanning electron microscope 100, a lens barrel 101 and a sample chamber 102 are integrated, and the inside thereof can be maintained in a high vacuum state. The lens barrel 101 is provided with an electron gun 111 that emits an electron beam 110 and an electron optical system 112 that controls irradiation of the electron beam 110. The electron optical system 112 includes a condenser lens 113 that condenses the electron beam 110 emitted from the electron gun 111, and a deflector 114 that scans the electron beam 110, and an objective lens 115 that converges the electron beam 110 to focus on the surface of the sample 120. In the illustrated example, a detector 131 that detects a signal 130 (for example, secondary electrons, reflected electrons, X-rays, and the like) generated by irradiating the sample 120 with the electron beam 110 is also provided in the lens barrel 101.

In the sample chamber 102, an openable and closable inlet/outlet port is provided and a sample holder 122 for electron microscope on which a sample support member (hereinafter referred to as "sample carrier") 121 is placed via the inlet/outlet port is accommodated. A sample 120 which an observation target is placed on the sample carrier 121. Although details will be described later, marks and patterns for positional alignment are formed or attached to the sample carrier 121.

An electron microscope sample stage 123 is provided in the sample chamber 102, and the electron microscope sample stage 123 includes a sample holder attached portion 124 for electron microscope to which a sample holder 122 for electron microscope can be detachably attached, and an electron microscope sample moving mechanism 125 that displaces a position and orientation of the sample 120 (and sample carrier 121) together with the sample holder 122 for electron microscope by moving, rotating, or tilting the sample holder attached portion 124 for electron microscope in a horizontal plane or in a direction perpendicular to the plane.

By controlling the sample moving mechanism 125 and the electron optical system 112 and irradiating a desired position of the sample 120 with the electron beam 110 by an electron microscope controller 152 of a system controller 103 and detecting the generated signal 130 with the detector 131, electron microscope observation of the sample 120 can be carried out at a desired position and magnification. In the following description, as the detector 131, a secondary electron detector suitable for detecting a surface structure of the sample 120 will be described as an example, but the detector 131 is not limited thereto. The detector can be applied according to a target and purpose of correlative observation. For example, a reflected electron detector can be used for the purpose of detecting the composition of the sample 120, or an X-ray detector can be used for the purpose of elemental analysis.

Although there is a difference that the electron microscope uses an electron beam and the optical microscope 104 uses visible light, the optical microscope 104 has the same basic configuration as the electron microscope, and an electron optical system of the electron microscope corresponds to an objective lens 140 and the detector of the electron microscope corresponds to an imaging element 141. A charge coupled device (CCD) or a CMOS sensor is used as the imaging element 141. Image data (still image or moving image) of the sample is acquired by the imaging element 141.

The sample carrier 121 is placed on a sample holder 142 for optical microscope of the optical microscope 104. An optical microscope sample stage 143 is provided in the optical microscope 104, and the optical microscope sample stage 143 includes a sample holder attached portion 144 for optical microscope to which a sample holder 142 for optical microscope can be detachably attached, and an optical microscope sample moving mechanism 145 that displaces a position and orientation of the sample 120 (and sample carrier 121) together with the sample holder 142 for optical microscope by moving, rotating, or tilting the sample holder attached portion 144 for optical microscope in a horizontal plane or in a direction perpendicular to the plane. The optical microscope sample moving mechanism 145 may be either an electric motor driven type or a manual type.

FIG. 2 is a functional block diagram of the system controller 103 in FIG. 1. The system controller 103 is configured with an optical microscope controller 151, an electron microscope controller 152, and an alignment controller 153. Each controller is realized as a computer in which a program that executes each function is installed, and communication between the controllers is assumed to be exchanged by TCP/IP communication. This is because the alignment function of the embodiment is not necessary when operating the scanning electron microscope alone or the optical microscope alone, and thus when each microscope is operated alone, unnecessary functions are hidden to improve usability of the user and to distribute the load on the central processing unit (CPU). However, when a computer having sufficient performance is provided, the system controller 103 may be configured by one computer. Here, a named pipe may be used to improve responsiveness. Even when the user has few opportunities to operate each microscope alone, it is preferable to realize the system controller with one computer and eliminate communication load between the controllers. Here, the computer refers to a control device including a CPU, a storage device such as a memory, an input/output device such as a keyboard, a mouse, and a monitor, and operates by executing a program by the CPU, and may be, for example, a general desktop PC, a notebook PC, a tablet terminal, or a smartphone, or may be a built-in microcomputer. The functions may be executed by a logic circuit such as FPGA, a parallel processing device such as GPU, or a distributed high-speed computer for the purpose of improving processing speed and shortening processing time in a part of processing of the program. Each controller includes a user interface (hereinafter referred to as "UI") for exchanging information with the user.

The optical microscope controller 151 has a control function of the optical microscope 104 that accompanies an operation by the user from the input/output unit. The optical microscope controller 151 is provided with an optical microscope operation input/output unit 210 that receives an operation from the user, and an optical system control unit 211 and an optical microscope sample moving mechanism control unit 212 set a field of view by respectively controlling the objective lens 140 of the optical microscope and the optical microscope sample moving mechanism 145 based on information input to the optical microscope operation input/output unit 210. The optical system control unit 211 also controls the imaging element 141, and images the field of view set according to the operation from the user. Here, the magnification set at this time and the coordinates position of the sample moving mechanism (hereinafter referred to as "field-of-view information") are linked to the image and managed. With the above configuration, the user can set any field of view with the optical microscope 104 based on their own operation and acquire image data and field-of-view information thereof. As field-of-view information, information in the height direction such as coordinates data in the height direction of the sample moving mechanism and the focus position of a camera may be included.

In the example of FIG. 2, the imaging element 141 is connected to an optical microscope image management unit 220 of the optical microscope controller 151, and imaged image data is directly sent to an image input unit 250 of the alignment controller 153. The imaging element 141 does not necessarily have to be connected to the optical microscope image management unit 220, image data of the imaged object targeted for observation may be saved based on a format of digital image data, and a saved image data file may be input to the image input unit 250 of the alignment controller 153. However, since the image and the field-of-view information need to be linked, embedding of the field-of-view information in the image data file, or managing and linking of the image data file in another format file is needed.

The electron microscope controller 152 has a control function of the scanning electron microscope 100 that accompanies an operation from the input/output unit by the user. The electron microscope controller 152 is provided with an electron microscope operation input/output unit 230 that receives an operation from the user, and an electron optical system controller 231 and an electron microscope sample moving mechanism control unit 232 set the field of view by respectively controlling the electron optical system 112 and the electron microscope sample moving mechanism 125 based on information input to the electron microscope operation input/output unit 230. A signal of the field of view is acquired by the detector 131, formed as an image by an electron microscope image generation unit 240, and drawn by an electron microscope observation image drawing unit 241 on an output device such as a monitor. With the above configuration, the user can set any field of view with the scanning electron microscope 100 and observe the field of view based on their own operation.

The alignment controller 153 has a function of transforming field-of-view information of the optical microscope 104 input by the user into field-of-view information of the scanning electron microscope 100 and controlling the electron optical system 112 and the sample moving mechanism 125 to thereby set the same field of view in the scanning electron microscope 100.

The alignment controller 153 includes an alignment processing unit 260 that controls the entire workflow for transforming (hereinafter, referred to as "alignment") the coordinate system of the optical microscope 104 and the coordinate system of the scanning electron microscope 100. In the embodiment, an affine transformation capable of correcting translation, rotation, scaling (enlargement and reduction), sharing (shear deformation), and the like is used as an alignment method. In order to calculate a transformation matrix of the affine transformation, image data of the optical microscope 104 and field-of-view information corresponding thereto and image data of the scanning electron microscope 100 and field-of-view information corresponding thereto are needed for at least three sets of optional identical points (hereinafter referred to as "positional alignment point").

The alignment controller 153 includes an image input unit 250 and a field-of-view information input unit 251, receives the image data imaged by the optical microscope 104 and the field-of-view information, scales and translates the image data based on the field-of-view information, and then displays the image data on an input image display unit 271.

A positional alignment point acquisition unit 280 acquires information about image data of the electron microscope image generation unit 240 corresponding to each of three positional alignment points specified with respect to the image data displayed on the input image display unit 271. Here, since the three points specified as the positional alignment points preferably have a positional relationship in which the three points are vertices of an equilateral triangle, the positional alignment points are preferably arranged so that the object desired to be observed fits within the triangle. To specify the three points, a specifying method such as specifying by an alignment mark provided on the sample carrier 121, specifying by attaching a seal indicating the alignment mark to the sample carrier 121, specifying by stamping a mark indicating the alignment mark, or specifying by a characteristic shape included in the image data can be applied. Each specifying method will be described later.

The alignment processing unit 260 calculates the transformation matrix for alignment using the image data of the three sets of positional alignment points and the field-of-view information acquired by the positional alignment point acquisition unit 280. The image data and the field-of-view information used for calculating the transformation matrix are saved in an alignment data management unit 261 configured with a memory on a computer or a storage device such as a hard disk so that the image data and the field-of-view information can be used during re-observation (this means that the sample carrier 121 once removed from the sample holder 122 is placed on the sample holder 122 again and observation is performed). In addition to storing the data for re-observation purpose, the predetermined distance and the image data may also be registered in the alignment data management unit 261 in order to utilize the sample carrier in which the positional alignment point is located at the predetermined position based on the design.

The alignment controller 153 includes a field-of-view input unit 281 and a field-of-view information calculation unit 262, acquires any field range information that the user desires to observe with respect to an optical microscope image from the field-of-view input unit 281, and transforms any field of view range information input into field-of-view information of the electron microscope 100 by using the transformation matrix obtained from the acquired positional alignment points by the field-of-view information calculation unit 262.

The alignment processing unit 260 controls the electron optical system 112 and the sample moving mechanism 125 of the scanning electron microscope 100 via the electron microscope operation input/output unit 230 for the transformed field-of-view information to match the field of view optionally input by the user with the field of view of the scanning electron microscope 100. An optical microscope image display unit (not illustrated) may be provided for the purpose of easily determining whether the same field of view is being observed, and optical microscope image data of the field of view range input by the user may be acquired from the alignment processing unit 260, and an optical microscope image of the same field of view may be drawn on the electron microscope observation image drawing unit 241 with transparency.

The alignment processing unit 260 has a function of automatically recognizing (hereafter referred to as "simple alignment function") the second and third points among the three points to be the positional alignment points when re-observing the target registered in the alignment data management unit 261. FIG. 3 illustrates a flowchart of the simple alignment function. Here, an example of using the simple alignment function when observing with a scanning electron microscope will be described, but the simple alignment function can be applied as long as the device is an observation device provided with a sample moving mechanism and a system for controlling the sample moving mechanism. Although the simple alignment function is more effective for a scanning electron microscope having a narrow field of view, the simple alignment function can also be used for an optical microscope, for example.

Step 301: First, the user operates the scanning electron microscope 100 from the electron microscope operation input/output unit 230 to fit the first positional alignment point within the field of view.

Step 302: The alignment processing unit 260 extracts image data of the first positional alignment point registered in the alignment data management unit 261 and creates template data for positional alignment from the extracted image data. Image processing of template matching is performed based on the image data and the template data acquired from the electron microscope image generation unit 240, and the positional alignment point and rotation angle are recognized.

Step 303: By calculating a relative distance between the positional alignment point and an image center position from the number of pixels of the positional alignment point from the image center position and a pixel size acquired from the electron optical system 112 and acquiring coordinates data of the image center position from the sample moving mechanism 125, the coordinates of the first positional alignment point (coordinates position of the sample moving mechanism 125 when the positional alignment point is at the center position of the image) are obtained. The sample moving mechanism 125 is controlled and moved to the next positional alignment point based on the relative distance between the rotation angle obtained in Step 302 and the next positional alignment point registered in the alignment data management unit 261.

Step 304: The second and third points are also recognized by repeating Steps 302 and 303 described above. Therefore, information about the positional alignment points other than the first point can be automatically acquired.

Although the user is supposed to perform movement of the field of view to the first point in the flowchart of FIG. 3, the alignment processing unit 260 may perform movement of the field of view by providing a mechanical mechanism to fix a relative positional relationship between an initial position (home position) of the sample movement mechanism and the first point of the positional alignment point and registering a relative position to the first point in the alignment data management unit 261. In particular, in a device having a narrow observation field of view such as a scanning electron microscope, automating the movement of the field of view to the first point is a great merit. On the other hand, in the case of an optical microscope, the merit is small because the first point can be easily fit within the observation field of view by controlling the sample moving mechanism while generally visually recognizing.

It was described that the positional alignment point is specified by an alignment mark provided on the sample carrier 121, or a seal or stamp indicating the alignment mark. FIGS. 4A and 4B illustrate configuration examples of alignment marks used for the sample carrier, the seal, and the like.

Generally, when observing a plant cell or biological cell, a rectangular or square cover glass or slide glass is used as the sample carrier 121 (that is, both the cover glass and the slide glass are used to place a sample, and the usage is the same). Therefore, when observing with a scanning electron microscope, the sample may be placed on the sample holder 122 in a state of being rotated by 90 degrees to 180 degrees with respect to the direction when observing with an optical microscope, and is inserted into the sample chamber 102. Since a round cover glass can be freely rotated, it is easily inserted in a state of being rotated. In fact, since the device such as the scanning electron microscope cannot visually recognize the scanning direction of the electron beam, in order to observe in the same direction as the optical microscope, it is difficult for the user to know in which direction the sample should be placed, and there is a high possibility that the sample is placed and inserted in a direction different from an intended direction. In the scanning electron microscope, the sample chamber needs to be kept in a state close to vacuum during observation, and it takes time to evacuate for observation. Therefore, once the sample is inserted incorrectly, several minutes to ten and several minutes are consumed to correct the rotation direction and re-observe, and efficiency of observation is significantly reduced. The sample holder 122 is provided with a counterbore portion in which a place where the sample carrier 121 is placed is made lower than the periphery by one step so that the sample carrier 121 can be easily attached. Since the counterbore portion has a size slightly larger than the size of the sample carrier 121, there is a concern that the sample carrier 121 rotates slightly even when the sample holder 122 is attached to the stage 123. Although it is a minute rotation, the rotation can cause a problem in the movement between the positional alignment points (Steps 301 and 303) of the simple alignment function illustrated in FIG. 3. For example, when the distance between the positional alignment points is 5 mm, if the rotation angle deviates by 3 degrees, calculation is made such that the sample deviates from an expected position based on the relative coordinates by about 260 μm. Since there are many cases where the scanning electron microscope is operated at magnification of a field of view of less than 200 μm, if the field of view deviates by 260 μm, the mark of the moving destination will be out of the field of view. Therefore, in the embodiment, an L-shaped mark whose rotation angle can be recognized is used.

FIG. 4A is a configuration example of the alignment mark. The alignment mark may be pre-displayed on the sample carrier 121, may be displayed on the seal, or may be stamped. The observation fields of view of the optical microscope 104 and the scanning electron microscope 100 are significantly different. For example, the field of view of the optical microscope 104 is determined by the magnification of the objective lens 140, the magnification of a camera adapter (not illustrated), and the size of the imaging element 141, and ranges from several tens of μm to several tens of mm. In contrast, the field of view of the scanning electron microscope 100 is determined by the setting conditions of the electron gun 111 and the electron optical system 112, and can be observed up to several hundred nm at a high magnification. When the magnification of the scanning electron microscope 100 is converted into a field of view, the magnification may be reduced to only several tens of μm depending on the conditions of the electron gun 111 and the electron optical system 112. Therefore, a large L-shaped mark 400 for observation (hereinafter referred to as "course mark") with the optical microscope 104 and a small L-shaped mark 401 for observation (hereinafter referred to as "fine mark") with the scanning electron microscope 100 are provided so that the L-shaped marks can be reliably seen in the fields of view of both devices.

Each shape has the same aspect ratio so that the shapes can be recognized by the same template by template matching. The size of the long side X and the short side Y of the L-shape is a size which is set considering an operation magnification of the simple alignment function, a mechanical error (for example, movement accuracy of one stroke of a motor) of the sample moving mechanism 125, and a rotation amount that cannot be detected by template matching. For example, assuming that, in the scanning electron microscope 100, the operating magnification of the simple alignment function is a field of view of 120 μm in the horizontal direction×90 μm in the vertical direction, the mechanical error of the sample moving mechanism 125 is ±10 μm, the distance between the positional alignment points is 5 mm, and a rotation angle can be discriminated in 0.1° increments, since there is a possibility that the fine mark 401 deviates from the center of the field of view by about ±20 μm, the long side X of the fine mark 401 is set to 80 μm and the short side Y is set to 50 μm or less to fit within the field of view range no matter which direction the sample deviates. On the other hand, a thickness T of an L-shaped line of the course mark 400 may be a thickness that can be visually recognized when observing with the optical microscope 104, and may be a range that fits within one field of view of the scanning electron microscope so that the user can recognize that the sample is on the line when observing with the scanning electron microscope 100. An interval S between the course mark 400 and the fine mark 401 may be the interval found from the positional alignment point (for example, point 402) of the course mark 400 using the minimum magnification of the scanning electron microscope 100 so that the user can easily find the fine mark 401.

The course mark 400 has a mark 430 for recognizing which position of the mark the user is looking at. In the example, each position is distinguished by the number of circular marks. As the marks can be distinguished from each other, the shape of the mark is any shape and may be a number or a symbol. Although the mark 430 is arranged in the course mark so that the user can recognize the mark at once when checking the course mark 400, the mark 430 may be arranged at a position close to the course mark 400 for the purpose of making processing common such as recognizing all the marks with the same template.

The embodiment may be realized by devising an arrangement position of the mark and an arrangement direction of the mark without attaching the mark 430. FIG. 4C illustrates an example in which the front and back and direction identification mark 451 and alignment marks 452a to 452d are provided on the surface of a round cover glass 450. The front and back and direction identification mark 451 is provided so that the user can easily distinguish the front and back and the direction of the sample carrier at the time of sample exchange. In the example, when rotated 180° to the right or left, since the alignment mark of the same shape comes to the expected same position, it is not possible to determine which state the alignment mark is in. Therefore, a plurality of alignment marks are arranged on the round cover glass so that the arrangement of the plurality of alignment marks 452a to 452d is not the same even if the round cover glass 450 is rotated at any angle. For example, the figures formed by the plurality of alignment marks arranged on the sample carrier are arranged to not be rotationally symmetric (meaning that the alignment mark overlaps with itself when rotated by (360/n)° around the center, but n>1).

The alignment mark whose rotation angle can be corrected is not limited to the L-shape, and may be any shape such as a character or symbol whose rotation angle is not point or line symmetric or rotation symmetric. For example, the mark may be a cross with unequal sides that is easy to recognize, or a special character or symbol shape that does not exist in the natural environment in order to reduce erroneous recognition of the mark.

When correction of the rotation angle is not premised, the shape may be point or line symmetric or rotational symmetric. The error in the attachment direction of the sample carrier 121 to the sample holder 122 as described above can be prevented by making the shape of the counterbore portion of the sample holder 122 so that the sample carrier 121 can be placed only in a specific direction. The problem when moving between positional alignment points of the simple alignment function can also be avoided by operating at a low magnification considering an amount of movement of the mark caused by rotation of an attachment error in order to keep the mark within the field of view. However, alignment at a low magnification tends to cause a large error, and in the case of the scanning electron microscope, if magnification is changed from low magnification to high magnification, since the center of the field of view may deviate, Restrictions such as difficulty in observing by changing to high magnification can occur.

As illustrated in FIG. 4B, a mark that can be recognized if a specific range fits within the field of view may be used. For example, a mark 420 is divided into two colors, and a L-shaped intersection 421, which is the boundary thereof, may be recognized as the positional alignment point. Here, since it is enough when the vicinity of the L-shaped intersection 421 is included in the field of view range, the field of view range needed for the simple alignment function can be narrowed. In the case of such a mark, since the entire shape does not need to be fitted within the field of view, only the mechanical error of the sample moving mechanism and the amount of rotation that cannot be detected by image processing need to be taken into consideration, the needed field of view is narrowed, and operation at a higher magnification becomes possible. However, processing time may be needed for template matching. This is because the position deviates according to the mechanical error of the sample moving mechanism and the amount of rotation that cannot be corrected and a ratio of two color regions changes.

FIG. 5A is a configuration example of a sample carrier 500 with alignment mark to which the alignment mark is attached described in FIG. 4A. An example in which the sample carrier a round cover glass is illustrated, but is not limited thereto, and one or more alignment marks 501 need to be attached so that positional alignment is possible no matter where the sample is placed on the sample carrier. Quartz glass is generally used as a material of the sample carrier 500, but the sample carrier may be made of a material such as metal. The shape is not limited to a circle, and may be a polygon such as a triangle or a quadrangle. A cover glass having a thickness of about 0.04 mm to 0.6 mm and a slide glass having a thickness of about 0.8 mm to 1.5 mm, which are generally used for observation with an optical microscope, can also be applied. In order to place the sample on the sample carrier 500 and observe the sample with a charged particle beam device, the sample and the sample carrier need to have conductivity. Therefore, when the material of the sample or sample carrier is non-conductive, a conductive material such as osmium, indium tin oxide (called ITO), gold, platinum, carbon, polythiophene, or anionic liquid is coated on the sample or the sample carrier to make the sample or the sample carrier conductive. Here, the conductive material to be used is appropriately selected to not affect observation with the charged particle device by coating.

On the surface of the round cover glass 500 illustrated in FIG. 5A, a plurality of alignment marks 501, a grid pattern 502, and an address mark 503 that are arranged so that the user can easily recognize the current observation field of view are provided. The grid pattern 502 is set at intervals according to the size of the widest observation field of view, and an area where the sample and the grid overlap is reduced as much as possible to not be included in the field of view as much as possible when observing the sample. The address mark 503 is arranged at the intersection of the grid patterns, and an address that designates an area surrounded by the grids is written therein. The address mark illustrated in FIG. 5A indicates an area of C row and 1 column. The interval of the grid pattern 502 is any interval, and may be coarser or may not be provided when one field of view area desired to be observed by the user is wide. For example, instead of providing a grid, points and symbols for specifying areas in the row direction and the column direction may be aligned at equal intervals (see FIG. 6).

Even when the sample is placed on the grid pattern 502 of the sample carrier 500, it is possible to check the grid pattern 502 under the sample. For example, when observing a biological sample by optical microscope observation, the grid pattern under the sample can be easily observed by adjusting intensity of a light source used for illumination. In the case of electron microscope observation, the signal generated from the grid pattern located under the sample can be detected by setting an acceleration voltage at which the electron beam can be transmitted through the sample. On the other hand, the surface of the sample can be observed by lowering energy of the electrons to the extent that the electrons do not transmit the sample.

Since the positional alignment points preferably have a positional relationship in which the positional alignment points deviate from one straight line as much as possible due to the characteristics of the affine transformation, as for the alignment marks selected as the positional alignment points, the triangle having the selected alignment marks as the vertices is preferably a right triangle or an isosceles triangle having a wide angle. Therefore, as illustrated in FIG. 5A, the alignment marks 501 are arranged to have a positional relationship in which the alignment marks forming such a triangle can be easily selected. The alignment marks 501 are arranged within a range 520 considering the attachment error of the sample holder (deviation of the placement position and deviation of the fixture such as a holding lid) to not hide the alignment marks 501 without fail. Although not illustrated in FIG. 5A, as described in FIG. 4A, each alignment mark is provided with a mark for specifying each alignment mark.

A front and back and direction identification mark 504 and a rotation direction alignment mark 505 are also provided so that the user can easily distinguish the front and back and the direction of the sample carrier at the time of sample exchange. By placing the sample carrier 500 on the sample holder by the user so that the observation field of view and the grid pattern 502 or the rotation direction alignment mark 505 are horizontal, it can be expected that the rotation angle of the sample carrier 500 with respect to the observation field of view is within a range of ±10° at the maximum.

A mark 506 for rotation correction may be provided for rotation correction of the simple alignment function. The shape of the mark 506 for rotation correction is the same as the shape of the fine mark. When imaging resolution of the scanning electron microscope is 800×600 pixels, deviation of a straight line having a rotation angle of 1° is an inclination of several pixels. In addition to noise, there may be many blurring caused by focus mismatch in the image, and thus there is a high possibility that the inclination of several pixels cannot be recognized due to such influences. Although the finer the correction of the rotation angle, the higher the resolution is needed, in general, the maximum for an imaging element of an optical microscope or the like is often about 5,000 pixels×5,000 pixels, and it is difficult to correct less than 0.2°. Here, when the mechanical error of the sample moving mechanism of the scanning electron microscope is sufficiently small, similar to the simple alignment function, the rotation angle may be obtained and corrected by moving the sample moving mechanism, recognizing the two marks 506 for rotation correction, and performing Helmart transformation from the acquired coordinates data of two points.

The pattern or mark attached to the sample carrier 500 may be observable with the optical microscope and the charged particle beam device, and a forming method thereof may be printing, vapor deposition, engraving, marking, or punching. The forming method and material may be appropriately selected according to the observation device.

A scale may be provided on the sample carrier 500 so that even a microscope that does not have control software as described with reference to FIG. 2 and does not know the field-of-view information can be obtain the field-of-view information. The scale needs to be a scale that covers the field of view range of each observation device, for example, in an optical microscope, the magnification is fixed by the magnification of the objective lens, intermediate lens, and camera adapter, and thus a scale may be arranged according to these magnifications.

An initial position mark 510 may be provided on the sample carrier 500. In the initial position mark 510 illustrated in FIG. 5B, a cross-shaped mark and a different number of round marks are provided in areas partitioned by the cross-shaped mark 510, and four directions are represented. The initial position mark 510 is a mark arranged at the initial position (home position) of the observation device. In a device such as a scanning electron microscope in which the observation field of view is narrow and the observation direction is difficult to understand, in general, the user recognizes the initial position and the rotation direction by moving a plurality of fields of view, but the user can recognize the rotation direction and the initial position without moving the field of view by arranging the initial position mark 510 at a position that becomes the initial position of the observation device. When the initial position mark 510 is provided, the movement to the first point in the simple alignment function may be automated by using the initial position mark 510. On the other hand, since the initial position (home position) of the observation device is usually the center position of the sample carrier 500, there is a high possibility that the initial position mark 510 overlaps the sample placed on the sample carrier.

While the alignment mark is permanently formed on the sample carrier in the form of FIG. 5A, a form in which a seal 600 with alignment mark is attached to a sample carrier 610 will be described using FIG. 6. FIG. 6 illustrates a state in which a seal with alignment mark displayed on an isosceles triangular carbon tape which is a base material of the seal is attached to the sample carrier 610. Both the shape and material of the seal are not limited to illustrative ones. For example, the material of the seal base material may be formed of a conductive material such as metal or a non-conductive material. However, since the seal is needed to have conductivity in order to observe the seal with the charged particle beam device, when the seal is non-conductive, the seal base material needs to be coated with a conductive material such as ITO, gold, platinum, carbon, polythiophene, or an ionic liquid to make the seal conductive. A plurality of alignment marks may be displayed on one seal.

The seal 600 with alignment mark is composed of a fine mark 601 on the inside and a course mark 602 on an outer edge, and a mark 603 for distinguishing each mark. The example in the figure is a mark using the outer edge of the seal, but is not limited thereto, and for the purpose of allowing deflection of the outer edge, an alignment mark may be displayed on the inside of the seal after providing a space for handling. For example, the L-shaped mark illustrated in FIG. 4A may be displayed at the center of the seal having a margin.

It is enough for the mark of the seal with alignment mark to be observable with an optical microscope and a charged particle beam device, and the forming method thereof may be printing, vapor deposition, engraving, marking, or punching. The forming method and material may be appropriately selected according to the observation device.

The alignment mark may be processed into rubber, plastic, metal or the like as a stamping material by a laser, a focused ion beam or the like, and stamped on the sample carrier with an oily pigment or dye.

The advantage of using a seal with alignment mark or a stamp for stamping an alignment mark is that the positional alignment point for alignment can be freely selected by attaching a seal with alignment mark or stamping the alignment mark after placing the sample on the sample carrier. When the observation target is a biological sample, it is difficult to control the position where the sample is placed on the sample carrier, and when the sample carrier is pre-marked with an alignment mark, apart of the alignment mark may be hidden depending on the position of the sample. Such a problem does not occur when the seal is attached or the alignment mark is stamped to provide the alignment mark after the sample is placed.

As described above, by setting the alignment mark on the sample carrier on which the sample is placed, the positional relationship between the alignment mark and the sample will not collapse even if the sample carrier is removed from the observation device. Therefore, the sample placed on the sample carrier can be observed with either an optical microscope or a scanning electron microscope, and a system with good reproducibility during re-observation can be realized. In the method of attaching the mark for positional alignment to the sample holder as in the related arts, the positional relationship between the mark for alignment and the sample changes considerably under the influence of deviation such as rotation of the sample carrier when the sample carrier is attached to the sample holder. With such method, such a problem can be avoided.

FIG. 7 is a bird's-eye view of the sample holder. A sample holder 700 uses a dedicated sample holder 700 that is easy to fix and place so that the sample is not damaged for re-observation, but is not limited thereto. It is enough when the sample holder is any mechanism which is conductive and can be fixed, for example, the sample carrier may be mounted on a sample mounting portion of a general sample holder with a carbon tape or the like, or may be saved together with the sample placing portion of the sample carrier such as a sample holder when it is intended to surely avoid damage in peeling from the carbon tape.

The sample holder 700 includes, as a main configuration, a sample mounting portion 713 on which the sample carrier 121 is placed, a sample base portion 711 serving as a base of the sample mounting portion 713, and a sample cover portion 712 for fixing the sample carrier 121. In order to improve efficiency of the sample exchange work, a counterbore portion 710 aligned to the shape and thickness of the sample carrier 121 used for observation is provided on the upper surface of the sample mounting portion 713 so that the sample carrier 121 placed on the counterbore portion 710 and the sample mounting portion 713 are made flat.

The sample cover portion 712 presses the sample carrier 121 from the upper surface, and brings the sample carrier 121 into contact with the sample mounting portion 713 and fixes it, thereby taking conductivity with the sample carrier 121 and reducing the influence of vibration. The sample cover portion 712 is fixed by a fixing jig 722 in a state of pressing down the sample carrier 121, the sample carrier 121 is irradiated with an electron beam from an opening 721, and the generated signal is detected, thereby performing observation of the sample.

The thickness of the cover glass illustrated in FIGS. 5A and 6 is generally 0.17 mm, which is very thin, and the cover glass may be damaged if the placement position is adjusted by directly touching the cover glass with tweezers or the like. Therefore, the sample mounting portion 713 has a rotary knob portion 714, and is configured to rotate and hold the sample carrier 121 placed on the sample mounting portion 713 at any angle while maintaining the sample carrier horizontal, by operating the rotary knob portion 714. Accordingly, the user can adjust the sample carrier 121 to any angle of 360° without damaging the sample carrier after placing the sample carrier 121.

In order to facilitate checking the rotation direction of the sample carrier 121, an orientation flat indicating the horizontal direction in an initial imaging field of view when observing with the scanning electron microscope 100 is provided in the opening 721. The user can efficiently and correctly place the sample carrier 121 on the sample holder 700 by taking a position parallel to the rotation direction alignment mark 505 and the grid pattern 502 (see FIG. 5A), which are easy to see. The shape for illustrating directionality may be a notch shape, and the direction for showing may be the vertical direction.

It is enough when a material forming the sample holder 700 is a non-magnetic material, which is electrically conductive, such as SUS316, SUS303, Al, C (graphite), Cu, Ta, Mo, Ti, W, brass, bronze, and a compound or alloy containing such substances.

Using FIG. 8, a recommended position guide for the positional alignment point displayed on a user interface (UI) of a program for setting the positional alignment point will be described. When a seal indicating the alignment mark is attached to the sample carrier 121, the alignment mark is stamped, or the positional alignment point is set according to a characteristic shape included in image data, setting is executed using the user interface in which the recommended position guide is displayed. Here, a guide 810 when the positional alignment points are three points will be described as an example, but when the positional alignment points of three or more points are set, a guide corresponding to the positional alignment points may be used.

When the affine transformation is used for alignment, the three points to be the positional alignment points preferably have a positional relationship in which the three points are vertices of an equilateral triangle, and the field of view desired to be observed is arranged to fit within the triangle. Therefore, as illustrated in FIG. 8, the recommended position guide 810 includes display portions 811a to 811c indicating a recommended position range of the positional alignment point, a display portion 812 indicating a range of a triangle for guiding the observation field of view to be arranged within the triangle constructed with the positional alignment points, a first input portion 813 for designating a range of a recommended position range 811 of the positional alignment point, a second input portion 814 for performing an enlargement and reduction operation of the display portion 812 while maintaining a recommended positional relationship between the three points, a third input portion 815 for performing a rotation operation of the display portion 812 while maintaining the recommended positional relationship between the three points, and a fourth input portion 816 for performing translation of the display portion 812 while maintaining the recommended positional relationship between the three points. For example, each input portion is illustrated by changing a mouse cursor to a shape of an arrow as illustrated in FIG. 8 when the mouse cursor or the like is focused on the display portion, and the guide is adjusted by a mouse drag operation. The user may guide the positional alignment point on the sample carrier 121 to fit within the recommended position range 811, or conversely, may select the positional alignment point from within the recommended position range 811. In any case, by using the recommended position guide 810, the user can ensure the accuracy of alignment and efficiently set the positional alignment point. The use of the UI using the recommended position guide 810 will be described in the workflow of the alignment system between the scanning electron microscope and the optical microscope described below.

FIG. 9 is an observation workflow of an observation sample by the optical microscope in the workflow of the alignment system illustrated in FIG. 1. The flow of FIG. 9 is operated by the user through the UI of the optical microscope operation input/output unit 210.

First, the sample 120 is placed on the sample carrier 121 (Step 901), the sample carrier 121 is placed on the sample holder 142 for optical microscope and the sample carrier 121 is fixed to not move due to the movement of the stage 143 during observation (Step 902), the sample holder 142 is attached to the stage 143 (Step 903). Here, when there is no mark or the like for positional alignment of the sample carrier 121, a seal with alignment mark for positional alignment (see FIG. 6) needs to be attached to the sample carrier 121 or stamp the alignment mark (steps 904,905). Here, the mark or the like for positional alignment in Step 904 may be the alignment mark described with reference to FIG. 5A, may be a characteristic structure of the sample 120, or may be something like a surface scratch on the sample carrier 121.

When the sample carrier 121 has an alignment mark (see FIG. 5A), in Step 901, the sample 120 is arranged to not overlap the alignment mark. However, when the observation target is a cell section, there is a method of drawing a thin section (sample) trimmed by a microtome and floating on water as it is with a slide glass (sample carrier). In the case of such a method, it is difficult to finely adjust the placement position of the sample, and the sample tends to be easily placed near the outer edge where the mark for positional alignment is placed. Here, if a seal with alignment mark is used or the alignment mark is stamped, there is no need to worry about the placement position of the sample in Step 901, and the mark for positional alignment can be provided later by Step 905. Here, the seal may be attached using the UI that uses the recommended position guide 810 illustrated in FIG. 8. FIG. 10A illustrates a UI screen 830 here. An observation image including a sample carrier (here, a rectangular slide glass) image 820 and an observation sample image 821 is displayed on the UI screen 830, and the recommended position guide 810 is superimposed and displayed on the image. The user adjusts the recommended position guide 810 so that the display portion 812 of the recommended position guide 810 includes the observation sample image 821. If the recommended position guide 810 can be adjusted, a seal 600 with alignment mark is attached to a position on a corresponding sample carrier for each of the three recommended position ranges 811 of the recommended position guide 810 while looking at the UI screen 830. Alternatively, the alignment mark is stamped. Therefore, according to the position of the sample placed on the sample carrier, the alignment mark can be arranged at a position where alignment accuracy can be expected. It is also preferable to use the sample carrier with alignment mark and the seal with alignment mark or the alignment mark stamp appropriately according to a method of placing the sample 120 on the sample carrier 121.

The same UI can be used when the characteristic structure of the observation image is used as the positional alignment point. An example thereof is illustrated in FIG. 10B. The user can set the positional alignment point at the position where alignment accuracy can be expected by adjusting characteristic structures such as the corners of the observation sample image 821 and an image 822 of a scratch on the sample carrier image 820 to be included in the three recommended position ranges 811 of the recommended position guide 810.

Return to the description of the flow of FIG. 9. In Step 906, for the sample carrier 121 on which the sample is placed, it is determined whether data (hereafter referred to as "master data") having field-of-view information (magnification set when the image of the positional alignment point was acquired and coordinates position of sample movement mechanism 145) corresponding to image data of all the positional alignment points on the sample carrier has been created. When the master data has not been created (in the case of first observation), master data is created (Step 907). The creation of master data will be described later with reference to FIG. 11. When the master data has been created (in the case of re-observation), the field-of-view information of the positional alignment point in main observation is acquired by using the master data (Step 908). In the case of re-observation, deviation of the placement position of the sample carrier on the sample holder 142 or the like occurs from the case of the first observation. Therefore, the field-of-view information of the positional alignment point in the master data is corrected to the field-of-view information in the re-observation. Details of the process will be described in FIG. 14. Step 908 may be omitted if the field-of-view information of the positional alignment point matches the master data, or as long as the user can ignore the mismatch as a minute error even if they do not match exactly. After that, the user observes the position of interest in the sample (Step 909).

The workflow for creating master data is illustrated in the flowchart of FIG. 11. FIG. 12 illustrates an example of a UI screen 1200 for creating the master data. The process of FIG. 11 is performed by the alignment processing unit 260 based on the user's device operation from the UI screen 1200.

The relative distance between the positional alignment points on the sample carrier may or may not be known from design data of the sample carrier or the like in some cases. An example of a known case is a case where the relative distance between the alignment marks is given by design data or the like in the case of the sample carrier 500 with the alignment mark as illustrated in FIG. 5A. The user selects, by using a design value/acquisition value selection radio button 1201 (see FIG. 12), whether to input the relative distance between the positional alignment points based on design data or the like or to input the relative distance between the positional alignment points by actually controlling the optical microscope 104 (Step 1101). When there is no known relative distance information, the design value/acquisition value selection radio button 1201 is set to "acquisition value" (Step 1102).

Subsequently, the observation position selection radio button 1210 is set to an N-th point (Step 1103), and the sample moving mechanism and the optical system are controlled so that the mark of the N-th point enters the field of view (Step 1104). The current field of view is displayed in a positional alignment point selection window 1215. In order to register an image displayed in the positional alignment point selection window 1215 as image data used for pattern matching, the sample moving mechanism and the optical system are controlled to be displayed in an appropriate size and position for that purpose. By pressing a field-of-view information acquisition button 1212, the image used for pattern matching is determined (Step 1105).

The positional alignment point is selected on the positional alignment point selection window 1215 (Step 1106). The position selected on the selection window 1215 is displayed by a selection position cursor 1221, and the relative distance to an (N−1)-th positional alignment point (0-th point is initial coordinates (home position)) calculated from the coordinates between the positional alignment points is displayed in a corresponding relative distance text box 1203. The relative distance is calculated based on the coordinates of the sample moving mechanism 145 and coordinates of the selection position cursor 1221 on the selection window 1215. The positional alignment point may be automatically set by image processing by making a position to be a positional alignment point in the alignment mark into a rule in advance.

In a top view 1216 illustrating the positional relationship between the points, the position selected as the positional alignment point is displayed by a positional alignment point mark 1231 based on the coordinates of the sample moving mechanism 145. In the example, a mark 1231-0 of the top view 1216 indicates an initial coordinates position, and a mark 1231-1 indicates a position of a positional alignment point of a first point.

After repeating Steps 1103 to 1106 up to a third point (Step 1107), a save button 1213 is pressed, and the acquired master data is saved in the alignment data management unit 261 (Step 1108).

When the initial position mark 510 (see FIG. 5B) is provided on the sample carrier, Steps 1103 to 1106 are executed for the initial position mark with N=0. Here, in Step 1106, the relative distance of the initial position mark 510 from the initial coordinates (home position) is displayed in an optical microscope initial coordinate value text box

1202. Here, the relative distance of the positional alignment point of the first point input to the relative distance text box 1203 is the relative distance of the initial position mark 510 from the positional alignment point.

In the case of the optical microscope for which the initial coordinates (home position) have not been set, the positional alignment point of the first point is used as a reference, a relative distance from the positional alignment point of the first point to the positional alignment point of the second point and a relative distance from the positional alignment point of the second point to the positional alignment point of the third point are registered.

On the other hand, when the relative distance between the positional alignment points is known, the design value/acquisition value selection radio button 1201 is set to "design value", and here, field-of-view information based on the image data and the design data is input from the UI screen 1200. Specifically, based on the design data, the initial coordinates position and the relative distance between the respective points are input to the relative distance text boxes 1202 and 1203, and the image data of each point is registered by an image registration button 1205 together with the magnification and the like with which the image was acquired.

An observation workflow in which sample observation with the optical microscope described with reference to FIG. 9 is performed and correlative observation is performed by the scanning electron microscope for the same observation position will be described. FIG. 13 is a flowchart of correlative observation by the scanning electron microscope in an alignment system between the scanning electron microscope and the optical microscope.

Step 1001: The sample carrier 121 observed with the optical microscope 104 is placed on the sample holder 122 for the scanning electron microscope 100 and fixed to not move due to the movement of the stage 123 during observation. When the sample carrier 121 or the sample 120 does not have conductivity, a pretreatment for imparting conductivity is performed before Step 1001.

Step 1002: The sample holder 122 to which the sample carrier 121 is fixed is attached to the stage 123.

Step 1003: The field-of-view information of the positional alignment point of the scanning electron microscope 100 is acquired. Step 1003 will be described in detail with reference to FIG. 14.

Step 1004: The alignment processing unit 260 executes alignment for obtaining a transformation matrix that transforms the coordinate system of the optical microscope and the coordinate system of the scanning electron microscope, based on positional information of the positional alignment point and magnification obtained from the field-of-view information of the positional alignment point of the optical microscope obtained in Step 907 or Step 908 of FIG. 9 and the position information of the positional alignment point and magnification obtained from the field-of-view information of the positional alignment point of the scanning electron microscope obtained in Step 1003 of FIG. 13.

Step 1005: Observation is performed with the scanning electron microscope. Here, the user designates the field of view desired to be observed with the scanning electron microscope for the optical microscope image displayed on the input image display unit 271, and the field-of-view information calculation unit 262 transforms the designated field-of-view into the field-of-view information of the scanning electron microscope by using the transformation matrix obtained in Step 1004, thereby capable of observing the designated field of view.

FIG. 14 is a flowchart for acquiring the field-of-view information of the positional alignment point, and FIG. 15 illustrates an example of a UI screen 1400 for acquiring the field-of-view information of the positional alignment point and executing the alignment. The process of FIG. 14 is performed by the positional alignment point acquisition unit 280 based on the user's device operation from the UI screen 1400.

First, since the UI screen 1400 is a window used by both the optical microscope (Step 908 in FIG. 9) and the scanning electron microscope (Step 1003 in FIG. 13), the observation device selection radio button 1401 is used to select which one to use. Here, since field-of-view information of the positional alignment point in the scanning electron microscope is to be acquired, the observation device selection radio button 1401 is set to "electron microscope" (steps 1301, 1302).

A read button 1402 is pressed to read the image data and field-of-view information of the positional alignment point. When the positional alignment point in the observation with the optical microscope (Step 909 in FIG. 9) is the master data itself (Step 907 in FIG. 9), the master data is read, and when the field-of-view information of the positional alignment point of the optical microscope is acquired and the field-of-view information of the master data is corrected (Step 908 of FIG. 9), image data of the master data and the corrected field-of-view information are read. Alternatively, the master data stored in the alignment data management unit 261 may be used even during re-observation. Here, the top view 1216 (same as in FIG. 12) illustrating the positional relationship between the positional alignment points is also displayed.

Next, an observation position selection radio button 1420 is set to an N-th point (Step 1304). The image data of the N-th positional alignment point read in Step 1303 is displayed on a positional alignment point display window 1430. The alignment processing unit 260 recognizes deviation in the rotation direction based on the image data of the positional alignment point read in step 1303, calculates the relative distance based on the field-of-view information, and moves the sample moving mechanism 125 to the position of the N-th point of the electron microscope. The coordinates after the movement are displayed on a coordinates position text box 1421, and the field of view after the movement is displayed on an observation field of view display window 1440. It is determined whether an alignment mark including a positional alignment point is included in the field of view range after the movement by automatic control by the alignment processing unit 260 displayed on the observation field of view display window 1440. When the entire alignment mark is within the field of view, the alignment processing unit 260 automatically recognizes the positional alignment point corresponding to the positional alignment point 1221 on the alignment mark 1220, and automatically executes processing of the next positional alignment point (Step 1305).

On the other hand, when the entire alignment mark is not included in the observation field of view display window 1440 as in the example of FIG. 15, the sample moving mechanism and the optical system are controlled so that at least the N-th positional alignment point 1442 is in the field of view, and the field-of-view information acquisition button 1422 is pressed. The alignment processing unit 260 inquires of the controller of the observation device for information and acquires the coordinates of the sample moving mechanism 125 in the current observation field of view (Step 1306).

The same position as the positional alignment point 1221 displayed on the positional alignment point display window 1430 is selected in the observation field display window 1440. The positional alignment point selection mark may be displayed at the selected position similarly as in FIG. 12. The coordinates of the positional alignment point 1442 are calculated based on the coordinates of the sample moving mechanism 145 and the coordinates of the positional alignment point 1442 on the observation field display window 1440, and the coordinates position text box 1421 is updated (Step 1307).

Steps 1304 to 1307 are repeated up to the third positional alignment point (Step 1308), and a save button 1403 is pressed to save information on the positional alignment point (Step 1309). Accordingly, the field-of-view information of the positional alignment point when observing with the optical microscope and the field-of-view information of the positional alignment point when observing with the scanning electron microscope were respectively obtained, and thus the alignment is executed by pressing an alignment execution button 1404 (Step 1004 of FIG. 13). Therefore, the observation field of view of the optical microscope and the observation field of view of the scanning electron microscope can be arranged (hereinafter, referred to as mapping) on the same two-dimensional coordinates.

The case of acquiring the field-of-view information of the positional alignment point of the optical microscope (Step 908 in FIG. 9) in the case of re-observation is also the same as the process of FIG. 14. Although repeated description is omitted, since the common UI screen 1400 is used in the embodiment, here, the observation device selection radio button 1401 is set to "optical microscope" (Step 1320).

FIG. 16 is an example of a UI of the input image display unit 271 (see FIG. 2). The user performs correlative observation while looking at a mapping image displayed on a window 1500.

The image information and the field-of-view information acquired with the optical microscope 104 in Step 909 of FIG. 9 are automatically transmitted from the optical microscope controller 151 to the alignment controller 153 by communication. The alignment processing unit 260 performs mapping on the sent image and displays the mapping image on the input image display unit 271 (window 1500).

After the alignment is completed, the observation is performed while looking at the mapping image displayed on the window 1500. The optical microscope image sent to the alignment controller 153 is arranged on a top view 1501 illustrating an entire observation range. By designating any field of view desired to be observed on the top view 1501, an optical microscope image of the designated field of view is displayed on a virtual field of view window 1502. Simultaneously, the alignment processing unit 260 controls the scanning electron microscope, automatically observes the same field of view, and displays the field of view on the scanning electron microscope observation image drawing unit 241. Accordingly, correlative observation becomes possible by comparing the image displayed in the virtual field of view window 1502 with the image displayed on the scanning electron microscope observation image drawing unit 241.

A path is provided from the scanning electron microscope controller 152 to the image input unit 250 and the field-of-view information input unit 251 of the alignment controller 153, and the corresponding field-of-view information (Step 1005 of FIG. 13) and the scanning electron microscope image acquired by the scanning electron microscope 100 may be automatically sent to the alignment controller 153 by communication. Accordingly, the electron microscope image and the optical microscope image can be superimposed and displayed, and the user can perform more intuitive correlative observation. FIG. 16 illustrates a display example of a UI screen 1500 here. A path from the image input unit 250 and the field-of-view information input unit 251 to the electron microscope observation image drawing unit 241 of the scanning electron microscope controller 152 may be prepared and the observation image of the electron microscope and the optical microscope image may be superimposed and displayed. When observing with the electron microscope, the optical microscope image is an acquired still image, but since the electron microscope is an observation image, it is possible to specify the same field of view by controlling the sample movement mechanism and optical system of the electron microscope even when the fields of view do not match slightly. When obtaining a high-quality image with less noise, the electron microscope needs to scan slowly and it may take time to acquire the image, and thus it is possible to efficiently perform correlative observation without re-taking by determining the same field of view first.

The optical microscope image and the electron microscope image sent to the alignment controller 153 are registered and managed for each image in an image list 1503. In the image list 1503, an optical microscope image 1521*a* and an electron microscope image 1522*a* are displayed as thumbnail images. An area of interest to the user is designated on the top view 1501 by an operation such as a mouse drag, and the designated area is displayed in the virtual field of view window 1502. By displaying a designated area 1512 on the top view, the user can easily recognize which area of the whole is being viewed by looking at the top view 1501. An optical microscope image 1521*b* and an electron microscope image 1522*b* of the designated area are superimposed and displayed on the virtual field of view window 1502. For the layer relationship of the superimposed images, the positional relationship between the front and back surfaces can be adjusted using an arrangement order change button 1541, and it is also possible to edit transparency and brightness of the superimposed image with an image correction slider 1504.

When superimposing the images on each other as such, a function of absorbing an error of affine transformation at the time of image acquisition may be provided during processing of the superimposed image. For example, when superimposing electron microscope images, the images may be individually selected and superimposed so that the images can be horizontally moved, rotated, and enlarged and reduced, an input unit may be provided to allow the user to perform horizontal movement, rotation, and enlargement and reduction operations so that the images are superimposed on each other, and the alignment processing unit 260 may be provided with processing to offset the amount of change as an error component of alignment (translation, rotation, and enlargement and reduction). An input unit in which translation, rotation, and enlargement and reduction are simply input from the text box as offsets may be provided. The image may be deformed by using image processing such as feature point matching.

Although the embodiments have been specifically described above, the present invention is not limited to the described embodiments, and it goes without saying that various modifications can be made thereto in a range without departing from the gist thereof.

For example, the method for alignment is not limited to the affine transformation, and may be any method capable of transforming a two-dimensional coordinate system. In some cases, the Helmart transformation that only corrects for translation and rotation can be used. For example, a case where the magnifications match, such as when re-observing with the same microscope, or a case where scaling correction is not always necessary are included. For example, if the mechanical error of the field-of-view information is large, or if the sample 120 is significantly deformed between the observation with the optical microscope and the observation with the electron microscope, even if the sample movement mechanism 125 is controlled to a field of view that theoretically matches by the affine transformation, there is little possibility that the expected field of view will be settled. Here, it is desirable to operate at a magnification that takes into consideration the degree of error and deformation.

Instead of a plurality of alignment marks, a plurality of positional alignment points may be set and aligned with respect to one alignment mark. For example, the positional relationship between two or three points within the mark is recognized using a mark whose rotation direction can be identified, and the sample moving mechanism 125 is moved with the relative coordinates with the first point as the origin after obtaining the rotation angle by obtaining the Helmart transformation or the affine transformation matrix. On the contrary, four or more alignment marks may be used. Samples that are easily contracted due to damage from electron beams, such as a cell section, and samples that require pretreatment before observation with the charged particle beam device are non-uniform and prone to local deformation. If contraction is average, alignment is possible by an affine transformation matrix based on three points that covers the whole, but a local error is difficult to absorb. Therefore, four or more positional alignment points may be prepared and alignment may be performed by the affine transformation matrix based on a combination of three positional alignment points.

The coordinates data in the field-of-view information may be calculated from the coordinates data of the sample moving mechanism of the observation device, the pixel position of the image data, and the pixel size. Template matching is performed for positional alignment, which has the advantage of giving the mark versatility. In contrast, the alignment mark may be used as a dedicated mark, and image processing specialized for the mark shape may be performed. The alignment mark may be extracted by preparing in advance various factors, such as noise and focus shift, that make it difficult to discriminate the image of the mark and a combination of rotated marks as learning data, and using a discriminator created by machine learning or deep learning.

The charged particle beam device configuring the alignment system is not limited to the scanning electron microscope. The charged particle beam device according to the present invention may be any device as long as the device includes a sample moving mechanism capable of optionally setting an observation position on a sample and an electron optical system capable of setting any field of view range, and can acquire observation conditions, such as the magnification during observation, with which dimensional information of the field of view range can be calculated and coordinates information of the sample moving mechanism, when acquiring an observation image of the sample by irradiating the sample with the charged particle beam. For example, the charged particle beam device may be a scanning ion microscope, a scanning transmission electron microscope, a transmission electron microscope, a composite device thereof and a sample processing device, or an analysis and inspection device to which the devices are applied.

The imaging device configuring the alignment system is not limited to the optical microscope. The imaging device according to the present invention may be any device as long as the device includes means for acquiring image data of an observation image, and is not limited to a shape such as an upright type or an inverted type, in addition to the presence of a sample moving mechanism and observation methods such as bright field of view, dark field of view, phase difference, differential interference, deflection, and fluorescence observation methods. For example, a biological microscope, a metallurgical microscope, an ultraviolet microscope, an infrared microscope, a measuring microscope, a confocal laser microscope, a charged particle beam device, or an imaging device using X-rays other than the charged particle beam device, an imaging device by ultrasonic wave, an imaging device by nuclear magnetic resonance imaging, a scanning probe microscope, a composite device thereof and a sample processing device, or an analysis and inspection device to which the devices are applied and the like are also included. Although the imaging device for research and industrial use is taken as an example, the embodiments can also be applied to a general digital camera.

The alignment mark and the seal with alignment mark attached to the sample carrier can be variously deformed depending on the observation device and the imaging device configuring the alignment system. For example, when the purpose is correlative observation between the biological microscope for observing with transmitted light and the confocal laser microscope, if the sample carrier 121 is a material that is optically transparent, such as glass, an optically opaque mark may be formed by partially printing or vapor depositing, and if the sample carrier 121 is an optically opaque material, a mark that can be recognized may be formed by punching and optically transparent. With the confocal laser microscope, the observation in the depth direction is possible by changing the focal position. In the case of a focused ion beam/electron beam processing device, the observation in the depth direction can be performed while physically shaving the surface of the sample 120. For the purpose of correlative observation between such observation devices, thick printing, vapor deposition, or marking may be performed. For the purpose of correlative observation with an observation device capable of observing fluorescence, the mark may be printed, vapor-deposited, or stamped with a material containing a fluorescent substance. For the purpose of correlative observation in the height direction of the measuring microscope or the laser microscope, the mark may be printed or vapor-deposited with a thickness, or may be engraved to form a mark having irregularities.

When information in the height direction of the sample surface can be acquired with the laser microscope or the like, the focal position may be adjusted by also acquiring information in the height direction as the field of view information in addition to the coordinates and relative distance on the plane and controlling the movement of the sample moving mechanism 125 of the scanning electron microscope 100 in the height direction or controlling the electron optical system 112. Accordingly, the user can perform correlative observation that is always in focus, improve the efficiency of observation, and shorten the work time.

REFERENCE SIGNS LIST

100: scanning electron microscope
101: lens barrel

102: sample chamber
103: system controller
104: optical microscope
110: electron beam
111: electron gun
112: electron optical system
120: sample
121: sample support member
122: sample holder for electron microscope
123: electron microscope sample stage
131: detector
140: objective lens
141: imaging element
142: sample holder for optical microscope
143: sample stage for optical microscope
151: optical microscope controller
152: electron microscope controller
153: alignment controller
400: course mark
401: fine mark
500: sample carrier with alignment mark
501: alignment mark
502: grid pattern
503: address mark
504: front and back and direction identification mark
505: rotation direction alignment mark
506: mark for rotation correction
510: initial position mark
600: seal with alignment mark
700: sample holder

The invention claimed is:

1. An alignment system comprising:
a sample carrier on which a sample is placed; and
a charged particle beam device including a charged particle optical system that irradiates the sample placed on the sample carrier with a charged particle beam and a detector that detects a signal generated by irradiating the sample with the charged particle beam; and
an alignment controller to which a first image obtained by imaging the sample placed on the sample carrier by an imaging device and field-of-view information of the imaging device corresponding to the first image are input, wherein
the alignment controller includes
a positional alignment point acquisition unit that acquires field-of-view information of a plurality of positional alignment points of the sample carrier placed on the charged particle beam device,
an alignment processing unit that obtains a transformation matrix that transforms a coordinate system of the imaging device and a coordinate system of the charged particle beam device based on position information and magnification of each of the plurality of positional alignment points when the first image is imaged by the imaging device and position information and magnification of each of the plurality of positional alignment points acquired by the positional alignment point acquisition unit, and
a field-of-view information calculation unit that transforms a field of view designated for the first image into field-of-view information of the charged particle beam device by using the transformation matrix, and
the plurality of positional alignment points are set on the sample carrier in a state where the sample is placed.

2. The alignment system according to claim 1, wherein
in the imaging device, the sample carrier fixed to the sample holder of the imaging device is placed on a stage of the imaging device, and the sample placed on the sample carrier is imaged,
in the charged particle beam device, the sample carrier fixed to the sample holder of the charged particle beam device is placed on a stage of the charged particle beam device, and the sample placed on the sample carrier is irradiated with the charged particle beam,
field-of-view information of the imaging device includes magnification when the imaging device images the sample and coordinates of the stage of the imaging device, and
field-of-view information of the charged particle beam device includes magnification when the charged particle optical system irradiates the sample with the charged particle beam and coordinates of the stage of the charged particle beam device.

3. The alignment system according to claim 2, wherein
the alignment controller includes an alignment data management unit that stores a plurality of second images obtained by imaging each of the plurality of positional alignment points of the sample carrier by the imaging device and the field-of-view information of the imaging device corresponding to each of the plurality of second images.

4. The alignment system according to claim 3, wherein
the positional alignment point acquisition unit acquires the field-of-view information of the plurality of positional alignment points of the sample carrier placed on the charged particle beam device by using the plurality of second images and the field-of-view information of the imaging device corresponding to each of the plurality of second images stored in the alignment data management unit.

5. The alignment system according to claim 3, wherein
the positional alignment point acquisition unit acquires the field-of-view information of the imaging device when the first image is imaged for each of the plurality of positional alignment points by using the plurality of second images and the field-of-view information of the imaging device corresponding to each of the plurality of second images stored in the alignment data management unit, and
the alignment processing unit obtains position information of each of the plurality of positional alignment points when the first image is imaged from the field-of-view information of the imaging device when the first image acquired by the positional alignment point acquisition unit is imaged.

6. The alignment system according to claim 1, wherein
the sample carrier includes a plurality of alignment marks for positional alignment, and
the plurality of alignment marks are arranged so that a figure formed by the plurality of alignment marks arranged on the sample carrier is not rotationally symmetric.

7. The alignment system according to claim 1, wherein
the sample carrier includes a plurality of alignment marks for positional alignment, and
the plurality of positional alignment points are set based on the alignment marks selected from the plurality of alignment marks in a state where the sample is placed.

8. The alignment system according to claim 1, wherein
the plurality of positional alignment points are set by attaching a seal indicating an alignment mark to the sample carrier or stamping an alignment mark.

9. The alignment system according to any one of claims 6 and 7, wherein
at least one of the plurality of alignment marks has a shape that is not point symmetric, line symmetric, or rotationally symmetric.

10. The alignment system according to claim 9, wherein the alignment mark includes a first mark that is recognizable by the imaging device and a second mark that is recognizable by the charged particle beam device, and
the first mark and the second mark have the same shape ratio.

11. An alignment system comprising:
a sample carrier on which a sample is placed;
a charged particle beam device including a charged particle optical system that irradiates the sample placed on the sample carrier with a charged particle beam, and a detector that detects a signal generated by irradiating the sample with the charged particle beam;
an imaging device that images the sample placed on the sample carrier;
an imaging device control unit that controls the imaging device; and
an alignment controller to which a first image obtained by imaging the sample placed on the sample carrier by the imaging device and field-of-view information of the imaging device corresponding to the first image are input, wherein
the imaging device control unit superimposes and displays a recommended position guide indicating recommended positions of a plurality of positional alignment points with respect to the sample carrier on an image of the sample carrier imaged by the imaging device, and
the alignment controller includes
an alignment data management unit that stores a plurality of second images obtained by imaging each of the plurality of positional alignment points set on the sample carrier by the imaging device using the recommended position guide and field-of-view information of the imaging device corresponding to each of the plurality of second images,
a positional alignment point acquisition unit that acquires field-of-view information of the plurality of positional alignment points of the sample carrier placed on the charged particle beam device,
an alignment processing unit that obtains a transformation matrix that transforms a coordinate system of the imaging device and a coordinate system of the charged particle beam device based on position information and magnification of each of the plurality of positional alignment points when the first image is imaged by the imaging device and position information and magnification of each of the plurality of positional alignment points acquired by the positional alignment point acquisition unit, and
a field-of-view information calculation unit that transforms a field of view designated for the first image into field-of-view information of the charged particle beam device by using the transformation matrix.

12. The alignment system according to claim 11, wherein
in the imaging device, the sample carrier fixed to the sample holder of the imaging device is placed on a stage of the imaging device, and the sample placed on the sample carrier is imaged,
in the charged particle beam device, the sample carrier fixed to the sample holder of the charged particle beam device is placed on a stage of the charged particle beam device, and the sample placed on the sample carrier is irradiated with the charged particle beam,
field-of-view information of the imaging device includes magnification when the imaging device images the sample and coordinates of the stage of the imaging device, and
field-of-view information of the charged particle beam device includes magnification when the charged particle optical system irradiates the sample with the charged particle beam and coordinates of the stage of the charged particle beam device.

13. The alignment system according to claim 11, wherein
the recommended position guide includes a plurality of first input portions for designating a recommended position range of the plurality of positional alignment points, a second input portion for performing an enlargement and reduction operation while maintaining a positional relationship between the plurality of first input portions, a third input portion for performing a rotation operation while maintaining the positional relationship between the plurality of first input portions, and a fourth input portion for performing translation while maintaining the positional relationship between the plurality of first input portions.

14. The alignment system according to claim 11, wherein
the plurality of positional alignment points are set on the sample carrier by adjusting the recommended position guide so that the sample or a characteristic structure of the sample carrier in an image of the sample carrier is included in each of the plurality of first input portions of the recommended position guide.

15. The alignment system according to claim 11, wherein
the plurality of positional alignment points are set on the sample carrier by attaching a seal to the sample carrier so that an image of the seal indicating an alignment mark is included in each of the plurality of first input portions of the recommended position guide, or by stamping the alignment mark so that an alignment mark is included in each of the plurality of first input portions of the recommended position guide.

16. The alignment system according to claim 8, wherein
the alignment mark has a shape that is not point symmetric, line symmetric, or rotationally symmetric.

* * * * *